US009601204B2

(12) United States Patent
Park et al.

(10) Patent No.: US 9,601,204 B2
(45) Date of Patent: Mar. 21, 2017

(54) THREE-DIMENSIONAL SEMICONDUCTOR DEVICES AND FABRICATING METHODS THEREOF

(71) Applicants:Jintaek Park, Hwaseong-si (KR); Youngwoo Park, Seoul (KR); Jaeduk Lee, Seongam-si (KR)

(72) Inventors: Jintaek Park, Hwaseong-si (KR); Youngwoo Park, Seoul (KR); Jaeduk Lee, Seongam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/523,977

(22) Filed: Oct. 27, 2014

(65) Prior Publication Data

US 2015/0138862 A1    May 21, 2015

(30) Foreign Application Priority Data

Nov. 15, 2013  (KR) .................. 10-2013-0139162

(51) Int. Cl.
| | |
|---|---|
| *G11C 5/02* | (2006.01) |
| *G11C 16/04* | (2006.01) |
| *G11C 16/10* | (2006.01) |
| *H01L 27/115* | (2017.01) |
| *H01L 27/06* | (2006.01) |
| *H01L 27/092* | (2006.01) |

(52) U.S. Cl.
CPC ............ *G11C 16/0466* (2013.01); *G11C 5/02* (2013.01); *G11C 16/10* (2013.01); *H01L 27/0688* (2013.01); *H01L 27/11573* (2013.01); *H01L 27/11575* (2013.01); *H01L 27/11582* (2013.01); *H01L 27/092* (2013.01)

(58) Field of Classification Search
CPC . G11C 2213/71; G11C 5/025; H01L 2924/00; H01L 21/50; H01L 25/0657; H01L 27/11568; H01L 27/1157; H01L 27/11575; H01L 27/11565; H01L 27/11519; H01L 27/11548; H01L 27/11578; H01L 27/2481; H01L 2924/14
See application file for complete search history.

(56) References Cited

U.S. PATENT DOCUMENTS 6,787,825 B1 *  9/2004  Gudesen ................. G11C 5/02
                                                            257/278
7,910,432 B2    3/2011  Tanaka et al.
(Continued)

FOREIGN PATENT DOCUMENTS

KR        20120120537        10/2012

*Primary Examiner* — Son Dinh
*Assistant Examiner* — Uyen B Tran
(74) *Attorney, Agent, or Firm* — Volentine & Whitt, PLLC

(57) ABSTRACT

A three-dimensional (3D) semiconductor memory device includes a CMOS circuit structure including a plurality of column blocks each comprising a plurality of page buffer circuits, and a lower wiring structure and a memory structure sequentially stacked over the CMOS circuit structure. The memory structure overlaps a first circuit region of the CMOS circuit structure and does not overlap a second circuit region of the CMOS circuit structure, and the plurality of column blocks are contained within the first circuit region of the CMOS circuit structure.

23 Claims, 27 Drawing Sheets

(56) References Cited

U.S. PATENT DOCUMENTS

| | | | |
|---|---|---|---|
| 8,335,109 B2* | 12/2012 | Seol | G11C 11/5628 365/185.05 |
| 8,345,479 B2 | 1/2013 | Maejima | |
| 8,593,847 B2* | 11/2013 | Kim | G11C 5/02 365/130 |
| 2002/0114178 A1* | 8/2002 | Sakui | G06F 13/4234 365/51 |
| 2007/0101309 A1* | 5/2007 | Wu | B82Y 10/00 257/758 |
| 2010/0052042 A1 | 3/2010 | Tanaka et al. | |
| 2010/0157670 A1* | 6/2010 | Chevallier | G11C 13/0007 365/185.2 |
| 2010/0159688 A1* | 6/2010 | Rinerson | G11C 11/5685 438/598 |
| 2010/0320526 A1 | 12/2010 | Kidoh et al. | |
| 2011/0284817 A1 | 11/2011 | Sasago et al. | |
| 2012/0063194 A1* | 3/2012 | Baek | G11C 5/025 365/148 |
| 2012/0176836 A1 | 7/2012 | Iguchi et al. | |
| 2012/0313072 A1* | 12/2012 | Baek | H01L 27/0688 257/4 |
| 2014/0239512 A1* | 8/2014 | Pellizzer | H01L 21/768 257/776 |
| 2014/0254245 A1* | 9/2014 | Tadepalli | G06F 12/0246 365/148 |

* cited by examiner

THREE-DIMENSIONAL SEMICONDUCTOR DEVICES AND FABRICATING METHODS THEREOF

CROSS-REFERENCE TO RELATED APPLICATIONS

A claim of priority under 35 U.S.C. §119 is made to Korean Patent Application No. 10-2013-0139162, filed on Nov. 15, 2013, in the Korean Intellectual Property Office, the entire contents of which are hereby incorporated by reference.

BACKGROUND

Example embodiments of the inventive concept relate to semiconductor devices. More particularly, example embodiments of the inventive concept relate to three-dimensional semiconductor devices and to methods of fabricating three-dimensional semiconductor devices.

Increased device integration is an important factor in realizing higher performance and lower cost semiconductor devices. In the case of two-dimensional (or planar) semiconductor memory devices (that is, memory devices in which memory cells are arrayed in a same plane), further integration is largely limited by the cost-effectiveness of available technologies for forming fine patterns in and on a semiconductor substrate. As pattern dimensions decrease, equipment costs can dramatically increase and the fabrication process can become cost-prohibitive.

In an effort to overcome such limitations, three-dimensional semiconductor memory devices are being developed in which the memory cells thereof are arrayed in three-dimensions over a substrate. However, in order achieve commercial viability, it will generally be necessary for three-dimensional semiconductor devices to equal the reliability and performance characteristics of their two-dimensional counterparts.

SUMMARY

According to example embodiments of the inventive concepts, a three-dimensional (3D) semiconductor memory device is provided which includes a CMOS circuit structure including a plurality of column blocks each comprising a plurality of page buffer circuits, and a lower wiring structure and a memory structure sequentially stacked over the CMOS circuit structure. The memory structure overlaps a first circuit region of the CMOS circuit structure and does not overlap a second circuit region of the CMOS circuit structure, and the plurality of column blocks are contained within the first circuit region of the CMOS circuit structure.

The column blocks may extend parallel to each other within the first region of the CMOS circuit structure, and each of the column blocks may further include a plurality of column selection circuits.

The page buffer circuits may be contained within a page buffer block of each column block, and the column selection circuits may be contained within a column selection block of each column block, and the page buffer block may extend parallel to the column selection block within each column block.

Each of the column blocks may further include at least one of a control logic block and a voltage generator block.

The memory structure may include a plurality of memory blocks, and each the column blocks may be aligned below at least one of the memory blocks, respectively.

The lower wiring structure may include a plurality of bit line structures located between a respective column block and the at least one of the memory blocks, and each of the bit line structures may be connected to the respective column block and to the at least one of the memory blocks.

The lower wiring structure may further include input/output (I/O) line structures connecting the column blocks to each other.

The CMOS circuit structure may be located at a substrate surface that extends horizontally, and the bit line structures and the I/O line structures may extend horizontally between the memory structure and the CMOS structure.

Each of the bit line structures may be connected to a page buffer circuit in a corresponding one of the column blocks of the CMOS circuit structure, and the column blocks may extend in a direction parallel to the bit line structures.

The device may further include a row selection block contained within the second region of the CMOS circuit structure.

The device may further include at least one of a control logic and a voltage generation block contained within the second region of the CMOS circuit structure.

According to other example embodiments of the inventive concepts, a three-dimensional (3D) semiconductor memory device is provided which includes a substrate, CMOS circuits located at a horizontal surface of the substrate, a plurality of bit line structures connected to the CMOS circuits and extending horizontally over the CMOS circuits, and a 3D memory cell array including a two-dimensional array of vertical structures over the bit line structures, each of the vertical structures including a plurality of memory cells. Each of the bit line structures is further connected to a plurality of the vertical structures of the 3D memory cell array.

The device may further include an input/output (I/O) line structure connected to the CMOS circuits and extending horizontally between the CMOS circuits and the bit lines structures.

The I/O line structure may extend in a same direction as the bit line structures.

A cross-sectional area of the I/O line structure may be greater than a cross-sectional area of each of the bit line structures.

The bit lines structures may be aligned below and connected to respective rows of vertical structures among the array of vertical structures.

The device may further include an upper wiring layer located over the 3D memory cell array and electrically connected to the bit line structures through the vertical structures.

Each of the memory cells may be a charge trap flash memory cell.

According to still other example embodiments of the inventive concepts, a three-dimensional (3D) semiconductor memory device is provided which includes a CMOS circuit structure, and a lower wiring structure and a memory structure sequentially stacked over the CMOS circuit structure. The memory structure includes first and second 3D memory array tiles located over the CMOS circuit structure, each of the 3D memory array tiles including memory cells arranged three-dimensionally. The CMOS structure includes a plurality of column blocks located below each of the first and second memory array tiles, and the lower wiring structure includes a plurality of bit line structures connected to the plurality of column blocks, respectively.

Each of the column blocks may include at least one page buffer block and at least one column selection block.

Each of the 3D memory array tiles may include a plurality of memory blocks, and the column blocks may be aligned below at least one of the memory blocks, respectively.

The column blocks and the bit line structures may extend in a direction parallel to each other below a corresponding one of the first and second memory array tiles.

Each of the bit line structures may be electrically connected to a page buffer circuit in a corresponding one of the plurality of column blocks and may be electrically separated from others of the plurality of column blocks.

At least one of the plurality of column blocks may further include at least one of a control logic and a voltage generation circuit.

The device may further include an I/O structure for electrically connecting the CMOS structure to an external electronic device, and the lower wiring structure may further include I/O line structures which electrically connect the column blocks to the I/O structure.

The I/O line structures may extend horizontally between the bit line structures and the CMOS structure.

An electrical resistance of each of the bit line structures may be greater than an electrical resistance of each of the I/O line structures.

A cross-sectional area of each of the I/O line structures may be larger than a cross-sectional area of each of the bit line structures.

The device may further include an upper semiconductor pattern located over the memory structure, and the memory structure may include a two-dimensional array of vertical patterns. Each of the bit line structures may be commonly connected to a respective row of vertical patterns among the array of vertical patterns, and the upper semiconductor pattern may be commonly connected to the array of vertical patterns, wherein the upper semiconductor pattern may be electrically connected to the bit line structures through the vertical patterns.

According to yet other example embodiments of the inventive concepts, a method of fabricating of a three-dimensional (3D) semiconductor memory device is provided which includes forming a CMOS structure on a substrate, the CMOS structure including a plurality column blocks arranged in respective rows, and forming a lower wiring structure including bit line structures on the CMOS structure, the bit line structures extending parallel to the rows of column blocks. The method further includes forming a memory structure on the lower wiring structure, the memory structure aligned over the CMOS structure and including a two-dimensional array of vertical patterns each extending vertically relative to the substrate, and forming an upper wiring structure including an upper semiconductor pattern on the memory structure, the upper semiconductor pattern being connected to the bit line structures through the vertical patterns.

The forming of the lower wiring structure may further include forming input/output (I/O) line structures connecting the column blocks to each other, before the forming of the bit line structures.

The lower wiring structure may be formed of materials exhibiting heat-resistant properties a maximum temperature utilized in the forming of the memory structure.

BRIEF DESCRIPTION OF THE DRAWINGS

Example embodiments will become readily understood from the detailed description that follows, with reference to the accompanying drawings, which represent non-limiting examples embodiments as described herein.

DETAILED DESCRIPTION

Figure 1:
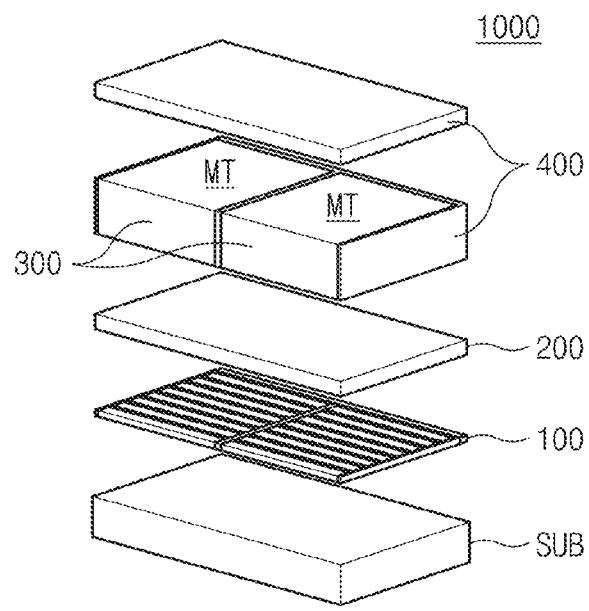
FIG. 1 is an exploded perspective view schematically illustrating a three-dimensional (3D) semiconductor device according to exemplary embodiments of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

The afore-described drawings are intended to illustrate the general characteristics of methods, structure and/or materials utilized in certain example embodiments and to supplement the written description provided below. These drawings may not, however, be to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. Where an element or feature has been previously described in the context of an earlier presented embodiment, another description of the same or similar element or feature may be omitted in the context of a later presented embodiment.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing techniques and/or tolerances. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an exploded perspective view schematically illustrating a three-dimensional (3D) semiconductor device according to exemplary embodiments of the inventive concept.

Referring to FIG. 1, a three-dimensional (3D) semiconductor device 1000 of this example includes a complementary metal-oxide semiconductor (CMOS) structure 100, a lower wiring structure 200, a memory structure 300, and an upper wiring structure 400. These structures are sequentially stacked over a substrate SUB as shown.

The substrate SUB may be formed of a semiconductor material. As examples, the substrate SUB may be a silicon wafer, or a multi-layered structure including at least one silicon layer. In addition, the substrate SUB may include one or more well regions doped with impurities.

The memory structure 300 of this example includes two or more memory array tiles MT as shown in FIG. 1. Each of the memory array tiles MT may include a plurality of memory blocks. In the example of this embodiment, each of the memory blocks includes memory cells that are three-dimensionally arranged relative to a surface of the substrate SUB. For example, assuming the surface of the substrate to define a horizontal plane, each of the memory blocks may include horizontal patterns sequentially stacked over the substrate SUB, vertical patterns intersecting the horizontal patterns, and memory elements interposed between sidewalls of the horizontal and vertical patterns. Detailed examples of horizontal patterns, vertical patterns and memory elements of memory blocks will be presented later herein.

The memory cells of the memory array tiles MT may be charge-storing-type memory cells, an example of which is the flash memory cell. Alternatively, the memory cells of the memory array tiles MT may be variable-resistance type memory elements, examples of which include phase-changeable RAM (PRAM) cells, resistive RAM (ReRAM) cells, and magnetic RAM (MRAM) cells. In example embodiments presented herein, the memory cells are flash memory cells, but the inventive concept is not limited thereto. In addition, in example embodiments presented herein, the flash memory cells are arranged as a NAND flash array structure, but again the inventive concept is not be limited thereto. As examples of other flash configurations, the memory cells may instead be arranged to constitute a NOR flash array structure or an AND flash array structure.

Figure 2:
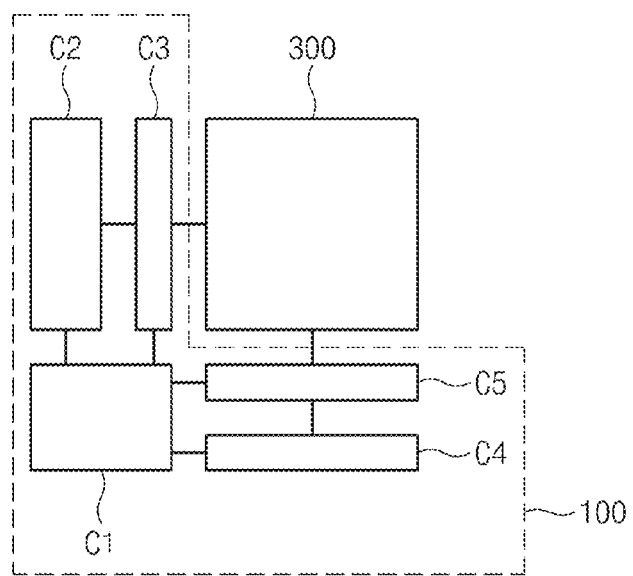
FIG. 2 is a block diagram illustrating circuits constituting a CMOS structure of a 3D semiconductor device, according to exemplary embodiments of the inventive concept.

FIG. 2 illustrates an example of various circuits which may constitute the CMOS structure 100 shown in FIG. 1. That is, in the example of FIG. 2, the CMOS structure 100 includes a control logic C1, a voltage generation circuit C2, a row selection circuit C3, a column selection circuit C4, and a read and write (R/W) circuit C5. Each of these circuits may be constituted by n-type and p-type metal-oxide-semiconductor (MOS) transistors integrated on the substrate SUB.

In operation, the voltage generation circuit C2 may be controlled by the control logic C1, and may be configured to generate electrical signals that are needed to operationally access (e.g., write, read and erase) the memory cells of the memory structure 300. In the example embodiments presented herein, the voltage generation circuit C2 is configured to generate a variety of NAND flash operational voltages.

The row and column selection circuits C3 and C4 may be configured to operationally connect the voltage generation circuit C2 to the memory structure 300. For example, each of the row and column selection circuits C3 and C4 may be configured to selectively provide electric pathways for electric access or connection to at least one of the memory cells of the memory structure 300, based on address information from the control logic C1. In this respect, the row and column selection circuits C3 and C4 may serve as address decoding circuits. Further, the row and column selection circuits C3 and C4 may be configured to apply signals generated in the voltage generation circuit C2 selectively to at least one of the memory cells of the memory structure 300. In this respect, the row and column selection circuits C3 and C4 may serve as drive circuits.

The R/W circuit C5 may be configured to write data to and/or read data from at least one of the memory cells and be controlled by the control logic C1. For example, the R/W circuit C5 may include at least one page buffer and/or at least one sense amplifier. The R/W circuit C5 may be selectively connected to an input and output (I/O) structure through the column selection circuit C4. In example embodiments, the R/W circuit C5 may be provided between the column selection circuit C4 and the memory structure 300.

Referring back to FIG. 1, the upper wiring structure 400 may include conductive plugs and conductive lines and be disposed on and/or around the memory structure 300 to connect the memory structure 300 to the lower wiring structure 200 or the CMOS structure 100. In example embodiments, the upper wiring structure 400 may include an I/O structure for allowing the CMOS structure 100 to be electrically connected to an external electronic device. The I/O structure may include metal pads. In other embodiments, the I/O structure may include through-silicon vias and/or metal patterns connected thereto.

The lower wiring structure 200 may include a plurality of bit line structures that are separated from each other. Each of the bit line structures may include bit lines electrically connecting the memory structure 300 to the R/W circuit C5 of the CMOS structure 100. Furthermore, the lower wiring structure 200 may include an I/O line structure connecting the column selection circuit C4 of the CMOS structure 100 to the previously mentioned I/O structure of the upper wiring structure 400. In example embodiments, in terms of vertical positions, the I/O line structure of the lower wiring structure 200 may be positioned between the bit line structures BLS of the lower wiring structure 200 and the CMOS structure 100.

FIGS. 3 through 6 are plan views illustrating examples of the disposition of the CMOS structure in each semiconductor chip, according to respective exemplary embodiments of the inventive concept.

In example embodiments such as those shown in FIGS. 3 through 6, the 3D semiconductor device 1000 may be provided in the form of a rectangular chip. In each chip of the 3D semiconductor device 1000, a plurality of memory array tiles MT may be provided which are spaced apart from each other. In order to reduce complexity of the drawings and to facilitate understanding of example embodiments of the inventive concept, the description that follows will refer to example embodiments in which the 3D semiconductor device 1000 has two memory array tiles MT which are spaced apart in a direction D1, as shown in FIGS. 3 through 6. However, example embodiments of the inventive concepts are not be limited to the provision of two memory array tiles MT.

In FIGS. 3 through 6, regions in which the CMOS structure (100 of FIG. 1) may be integrated in the substrate (SUB of FIG. 1) are shown cross-hatching. As illustrated, the CMOS structure may include a covered region(s) CR which is located below the memory the memory array tiles MT (i.e., the memory structure 300 of FIG. 1) and an exposed region(s) ER which is not located below the memory array tiles MT. In other words, in a plan view, the covered region(s) CR of the CMOS structure may be integrated on a portion(s) of the substrate that is covered and overlapped by the memory array tiles MT, while the exposed region(s) ER of the CMOS structure may be integrated on another portion(s) of the substrate that is not covered and overlapped by the memory array tiles MT. In example embodiments, a number of covered regions CR depends on the number of memory array tiles, and thus the examples of FIGS. 3 through 6 each include two covered regions CR. Likewise, as will be described in the examples presented below, the exposed region ER may include multiple regions (or sections) depending on the number and locations of the memory array tiles MT. These regions may include one or more peripheral exposed regions extending along the periphery of the chip 1000, and one or more intermediate exposed regions located between the memory array tiles MT.

Figure 3:
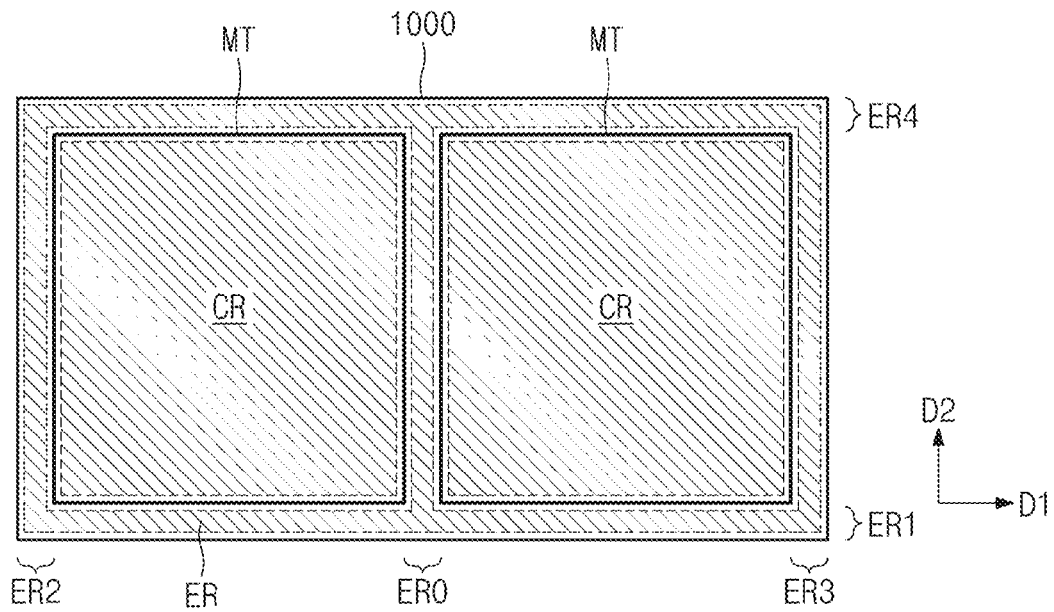
FIGS. 3, 4, 5 and 6 are plan views illustrating dispositions of a CMOS structure in each semiconductor chip, according to respective exemplary embodiments of the inventive concept.

In the example of FIG. 3, the exposed region ER includes an inner region ER0 located between the memory array tiles MT, and a peripheral exposed region. Here, the peripheral exposed region includes a first exposed region ER1 and a fourth exposed region ER4, which extend lengthwise in a direction parallel to the first direction D1, and a second exposed region ER2 and a third exposed region ER3, which extend lengthwise in a direction perpendicular to the first direction D1 (i.e., in the direction D2). In other words, in the example of this embodiment, the second and third exposed regions ER2 and ER3 extend perpendicular to the first and fourth exposed regions ER1 and ER4. As shown, the first and fourth exposed regions ER1 and ER4 extend along opposite edges, respectively, of the chip 1000, and the second and third exposed regions ER2 and ER3 extend along other opposite edges, respectively, of the chip 1000.

Figure 4:
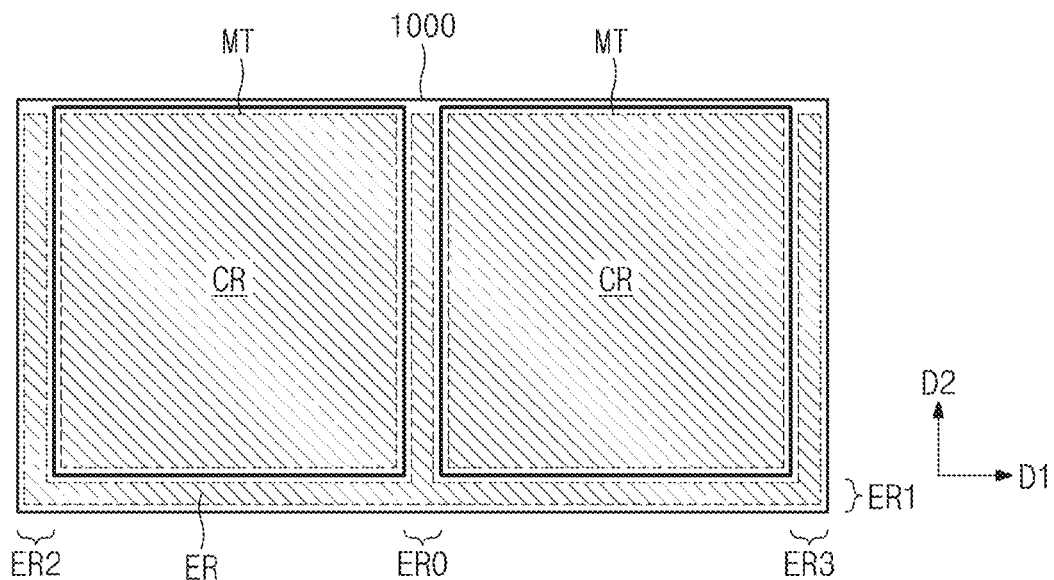

In the example of FIG. 4, the exposed region ER includes an intermediate exposed region ER0 located between the memory array tiles MT, and a peripheral exposed region. Here, the peripheral exposed region includes a first exposed region ER1 extending lengthwise in a direction parallel to the first direction D1, and the second and third exposed regions ER2 and ER3 extending lengthwise in a direction perpendicular to the first direction D1 (i.e., in the direction D2). The first exposed region ER1 extends along one edge of the chip 1000, and the second and third exposed regions ER2 and ER3 extend along other and opposite edges, respectively, of the chip 1000. When compared to the embodiment of FIG. 3, the embodiment of FIG. 4 is devoid of a fourth exposed region ER4 of FIG. 3.

Figure 5:
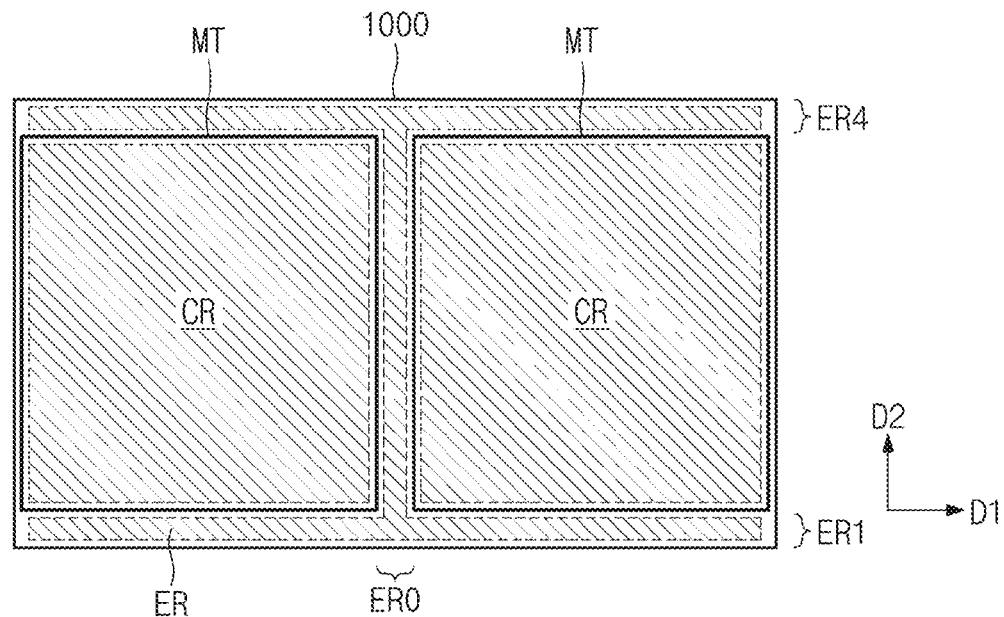

In the example shown in FIG. 5, the exposed region ER includes an intermediate exposed region ER0 located between the memory array tiles MT, and a peripheral exposed region. Here, the peripheral exposed region includes first and fourth exposed regions ER1 and ER4 extending lengthwise in a direction parallel to the first direction D1. That is, in this example, the first and fourth exposed regions ER1 and ER4 extend along two opposite edges, respectively, of the chip 1000. When compared to the embodiment of FIG. 3, the embodiment of FIG. 5 is devoid of a second and third exposed regions ER2 and ER3 of FIG. 3.

Figure 6:
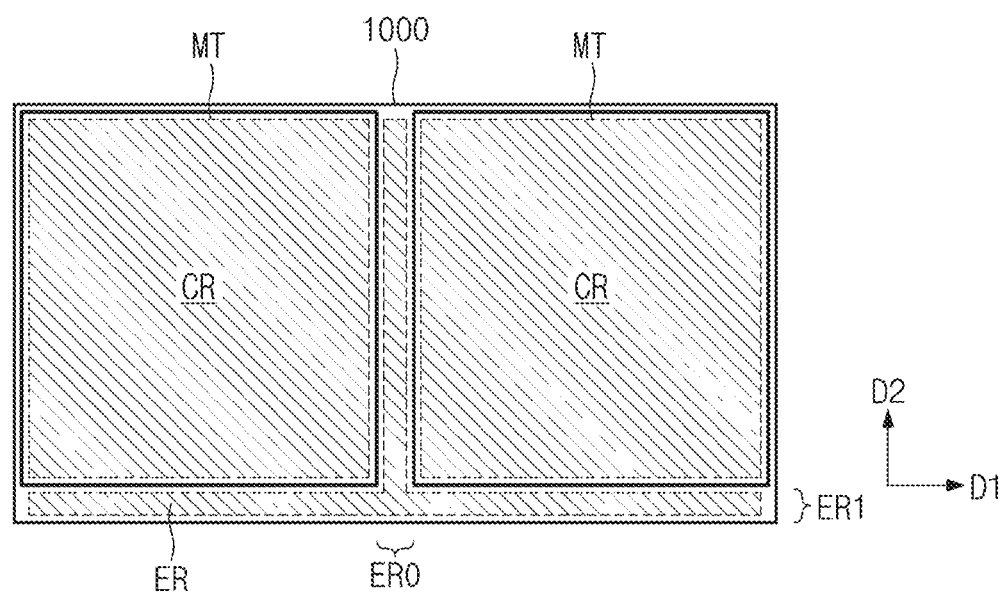

In the example of FIG. 6, the exposed region ER includes an intermediate exposed region ER0 located between the memory array tiles MT, and a peripheral exposed region. Here, the peripheral exposed region includes a first exposed region ER1 extending lengthwise in a direction parallel to the first direction D1 along one edge of the chip 1000. When compared to the embodiment of FIG. 3, the embodiment of FIG. 5 is devoid of a second, third and fourth exposed regions ER2, ER3 and ER4 of FIG. 3.

Figure 7:
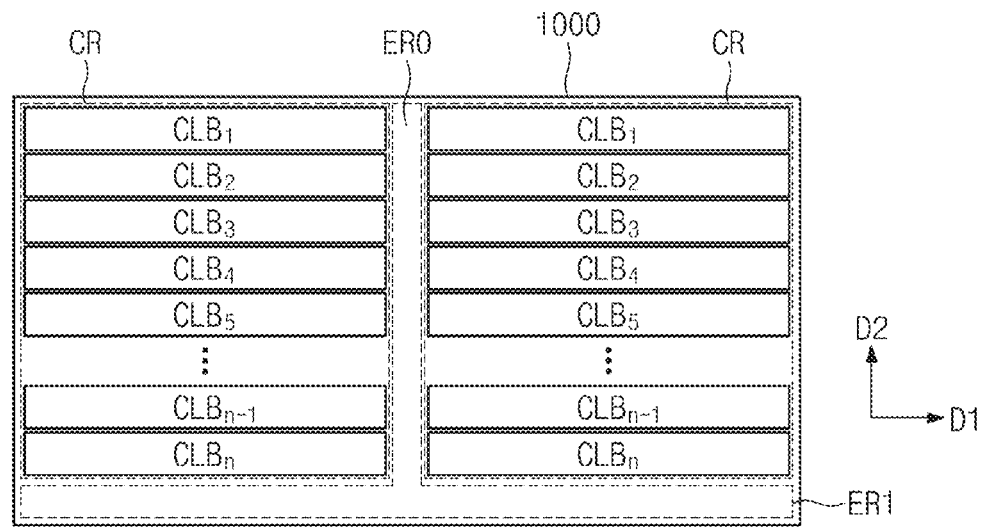
FIG. 7 is a plan view illustrating an example of internal structures of a covered region of a CMOS structure, according to exemplary embodiments of the inventive concept.
Figure 8:
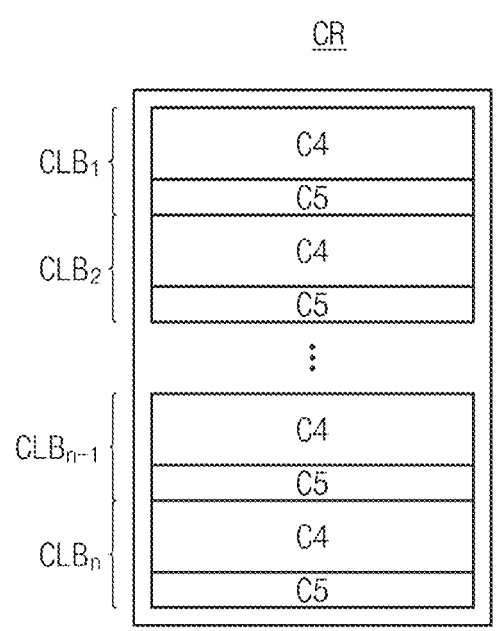
FIG. 8 is a plan view illustrating an example of internal structures of a column block, according to exemplary embodiments of the inventive concept.

FIG. 7 is a plan view illustrating an example of internal structures of the covered region CR of the CMOS structure (100 of FIG. 1), according to exemplary embodiments of the inventive concept, FIG. 8 is a plan view illustrating an example of internal structures of the column blocks of FIG. 7, according to exemplary embodiments of the inventive concept. In order to reduce complexity of the drawings and to facilitate understanding of example embodiments of the inventive concept, the description that follows will refer to an example embodiment in which the 3D semiconductor device is configured to have a peripheral exposed region (ER0 and ER1) such as that described above with reference to FIG. 6, but example embodiments of the inventive concepts may not be limited thereto. It will be understood the internal structure of the covered region CR to be described below may be similarly or identically applied to the embodiments of FIGS. 3 through 5 and variations thereof.

Referring to FIG. 7, the CMOS structure may include a plurality of column blocks $CLB_1, CLB_2, \ldots, CLB_n$, located below each of the memory array tiles MT, i.e., within each of the covered regions CR. Herein, as will be readily understood by those skilled in the art, the term "block" means an area or region of a device containing circuits or elements generally dedicated to a given or similar function. As will be explained below herein, each of the column blocks of the example embodiments contains plural data buffering circuits and/or plural column (or bit line) selection circuits.

The column blocks $CLB_1, CLB_2, \ldots, CLB_n$ may each extend lengthwise parallel to the direction D1, and may be juxtaposed in a second direction D2 perpendicular to the direction D1. In example embodiments, each of the column blocks $CLB_1, CLB_2, \ldots, CLB_n$ is configured to independently execute read and write operations. As a result, read and write operations may be respectively executed in different ones of the column blocks $CLB_1, CLB_2, \ldots, CLB_n$ simultaneously. This can allow for an increased page depth of the 3D semiconductor device 1000.

To realize the independent operation of the column blocks $CLB_1, CLB_2, \ldots, CLB_n$, each of the column blocks $CLB_1, CLB_2, \ldots, CLB_n$ may include at least one R/W circuit and at least one column selection circuit. For example, as exemplarily shown in FIG. 8, each of the column blocks $CLB_1, CLB_2, \ldots, CLB_n$ may include a column selection circuit C4 and a R/W circuit C5. In this particular example embodiment, each column selection circuit C4 occupies a rectangular region extending lengthwise parallel to the direction D1 (FIG. 7), and each R/W circuit C5 occupies a rectangular region extending lengthwise parallel to the D1 direction. In addition, in this particular example embodiment, the column selection circuits C4 and R/W circuits C5 are alternately juxtaposed in the direction D2 (FIG. 7).

However, the structure of each of the column blocks $CLB_1, CLB_2, \ldots, CLB_n$ is not limited to layout shown in FIG. 8. As one example variation, within each of the column blocks $CLB_1, CLB_2, \ldots, CLB_n$, a number of the column selection circuits C4 and the R/W circuits C5 may be changed from that of FIG. 8. As another example variation, an adjacent pair of the column blocks $CLB_1, CLB_2, \ldots, CLB_n$ may be disposed to have a mirrored symmetry relative to each other, or be configured to share a column selection circuit C4 or R/W circuit C5.

Furthermore, in each of the column blocks $CLB_1, CLB_2, \ldots, CLB_n$, the inventive concept is not limited to the column selection circuit C4 and the R/W circuit C5 being disposed within rectangular-shaped contiguous regions shown in FIG. 8. For example, one or both of the column selection circuit C4 and the R/W circuit C5 may be a formed of a plurality of partial circuits that are spaced apart from each other in each of the column blocks $CLB_1, CLB_2, \ldots, CLB_n$. In addition, in consideration of other technical issues (e.g., electric accessibility to bit lines), the partial circuits may be one- or two-dimensionally distributed within an internal region of each of the column blocks $CLB_1, CLB_2, \ldots, CLB_n$.

It is also noted that the R/W circuit C5 of each of the column blocks $CLB_1, CLB_2, \ldots, CLB_n$, may include a plurality of buffer memory elements. A number of buffer memory elements of each R/W circuit C5 may be in one-to-one, many-to-one, or one-to-many correspondence with respect to a number bit lines which cross over each of the column blocks $CLB_1, CLB_2, \ldots, CLB_n$.

FIGS. 9 through 12 are plan views schematically illustrating dispositions of the control logic C1, the voltage generation circuit C2, and the row selection circuit C3 of FIG. 2, according to exemplary embodiments of the inventive concept. Again, the configuration of previously described FIG. 6 is used by way of example only.

Figure 9:
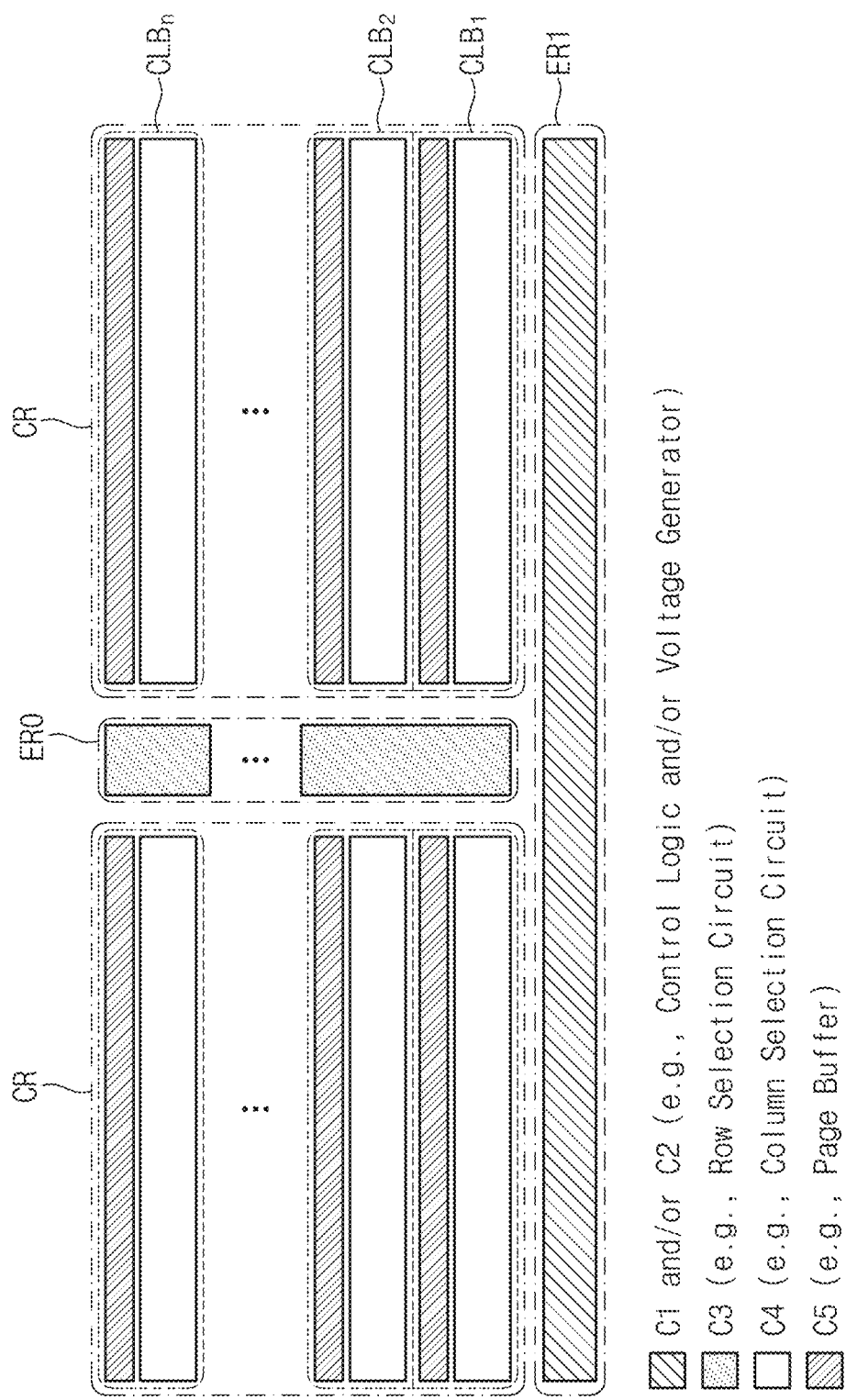
FIGS. 9, 10, 11 and 12 are plan views schematically illustrating dispositions of a control logic, a voltage generation circuit, and a row selection circuit, according to respective exemplary embodiments of the inventive concept.

Referring to the example of FIG. 9, each of the column blocks $CLB_1, CLB_2, \ldots, CLB_n$ may be configured to include the column selection circuit C4 and the R/W circuit C5 (e.g., page buffer). The first exposed region ER1 may be configured to include the control logic C1 and the voltage generation circuit C2, and the intermediate exposed region ER0 may be configured to include the row selection circuit C3.

Figure 10:
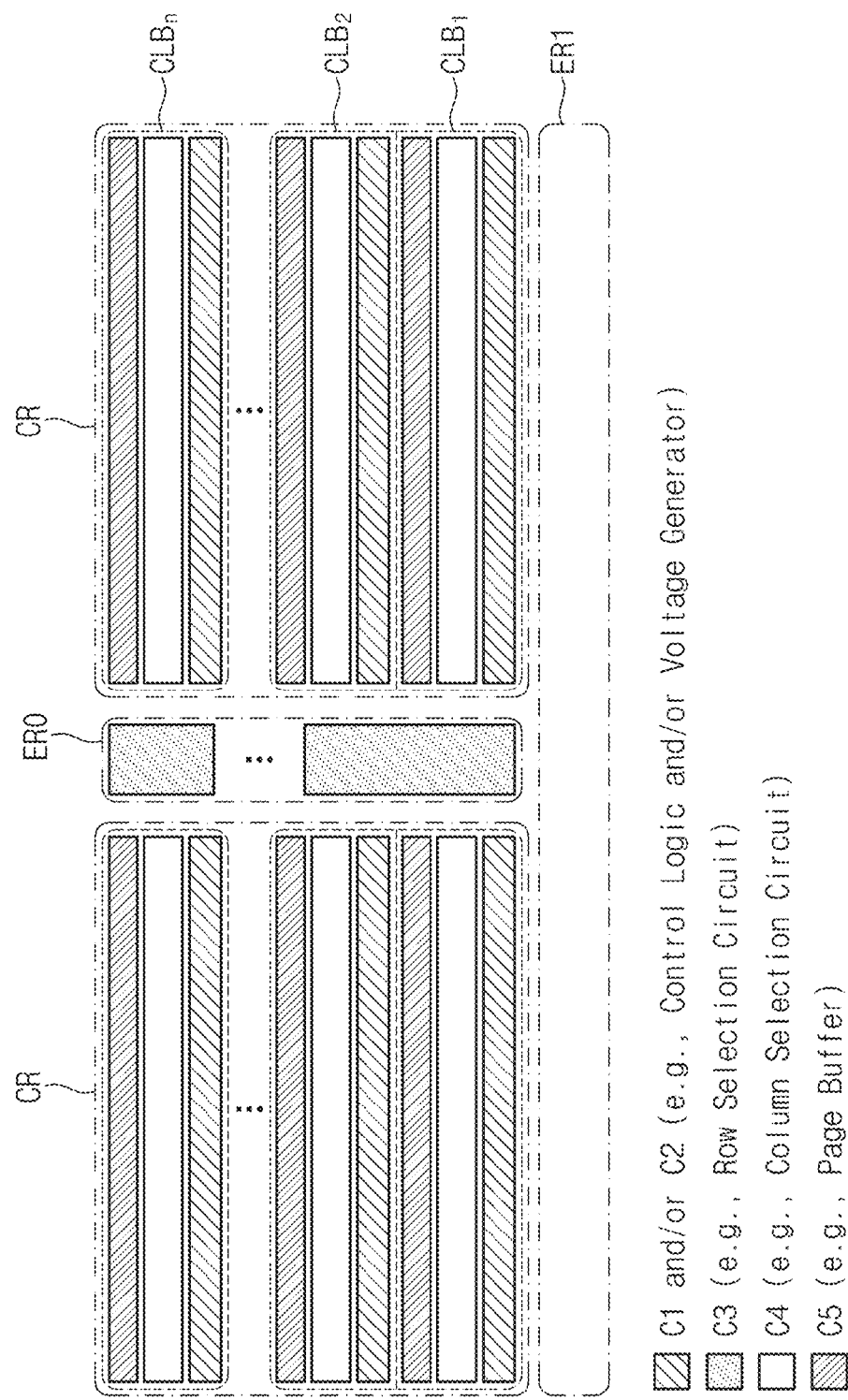

Referring to the example of FIG. 10, each of the column blocks $CLB_1, CLB_2, \ldots, CLB_n$ may be configured to include the control logic C1, the voltage generation circuit C2, the column selection circuit C4, and the R/W circuit C5. The intermediate exposed region ER0 may be configured to include the row selection circuit C3, while the first exposed region ER1 may be unused or used for different functionality.

Figure 11:
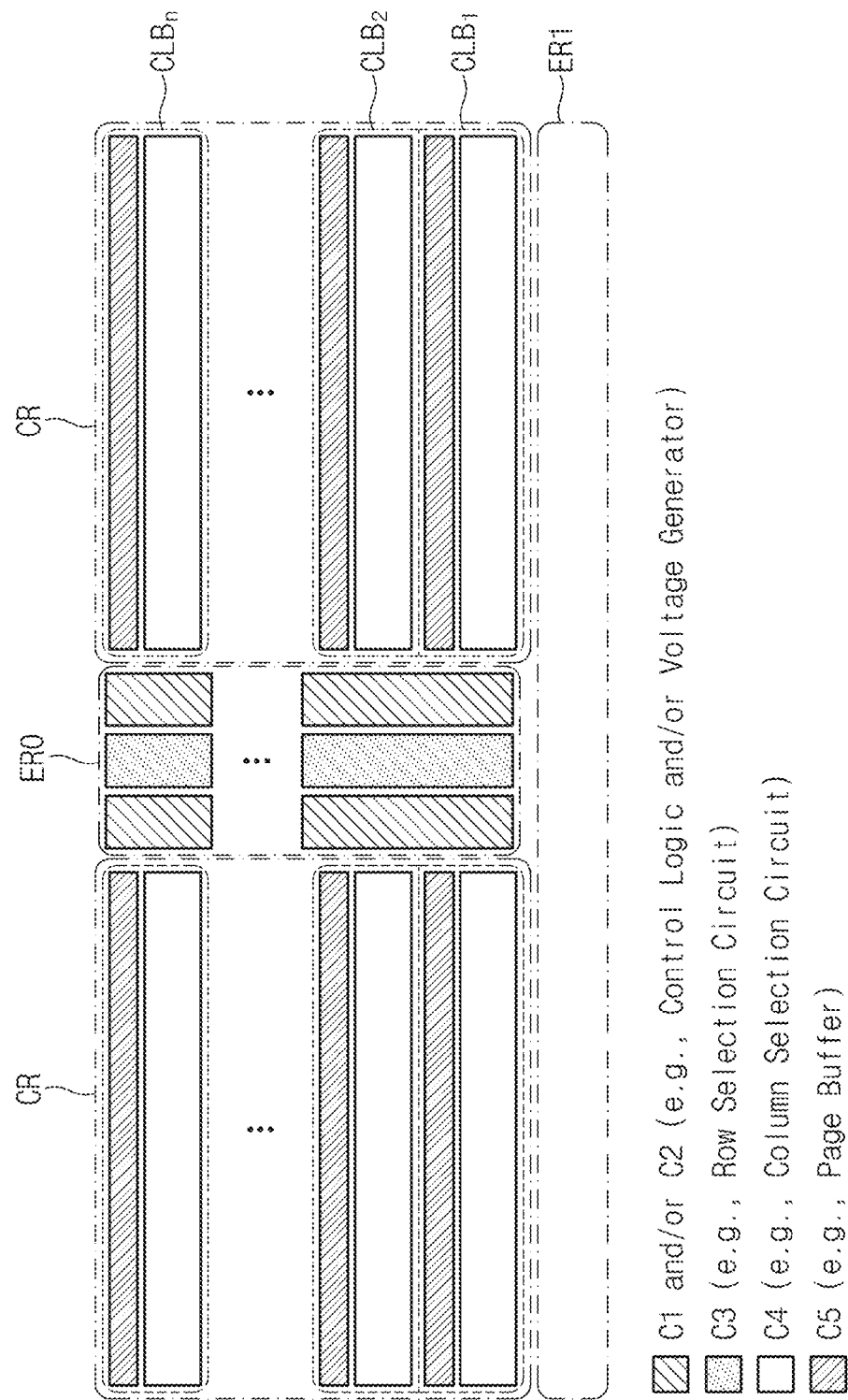

Referring the example of FIG. 11, each of the column blocks $CLB_1$, $CLB_2$, ..., $CLB_n$ may be configured to include the column selection circuit C4 and the R/W circuit C5. The intermediate exposed region ER0 may be configured to include the control logic C1, the voltage generation circuit C2, and the row selection circuit C3. The first exposed region ER1 may be unused or used for different functionality.

Figure 12:
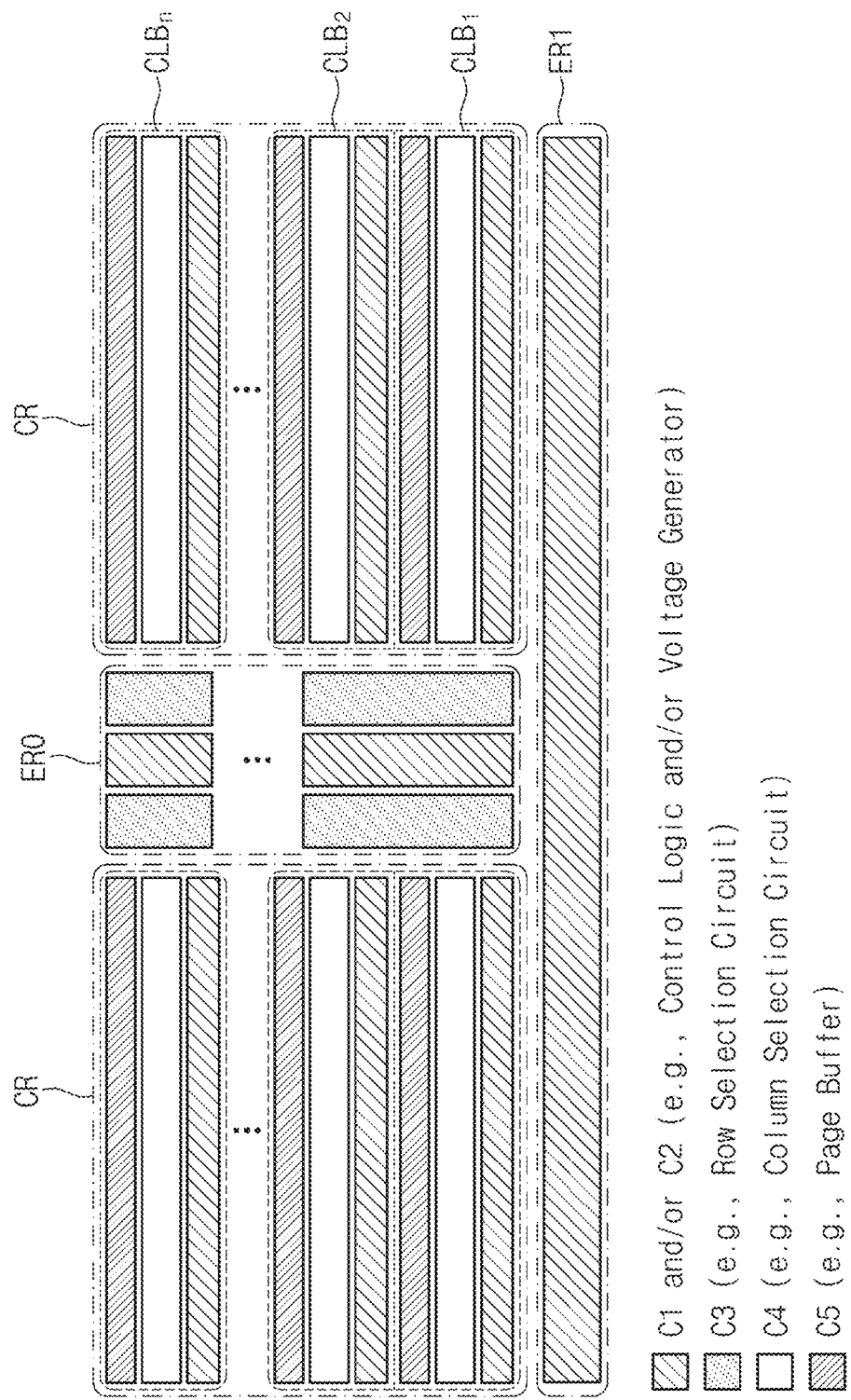

Referring to the example of FIG. 12, each of the column blocks $CLB_1$, $CLB_2$, ..., $CLB_n$ may be configured to include the control logic C1, the voltage generation circuit C2, the column selection circuit C4, and the R/W circuit C5. The intermediate exposed region ER0 may be configured to include the row selection circuit C3, and other portion of the control logic C1 and/or the voltage generation circuit C2. Also, yet another portion of the control logic C1 and/or the voltage generation circuit C2 may be disposed in first exposed region ER1.

Figure 13:
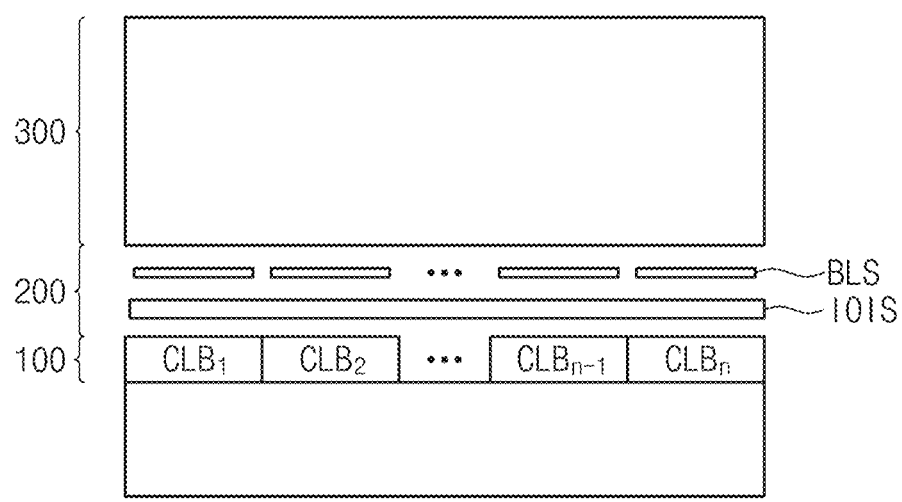
FIG. 13 is a sectional view schematically illustrating an example of dispositions of a lower wiring structure relative to column blocks, according to exemplary embodiments of the inventive concept.
Figure 14:
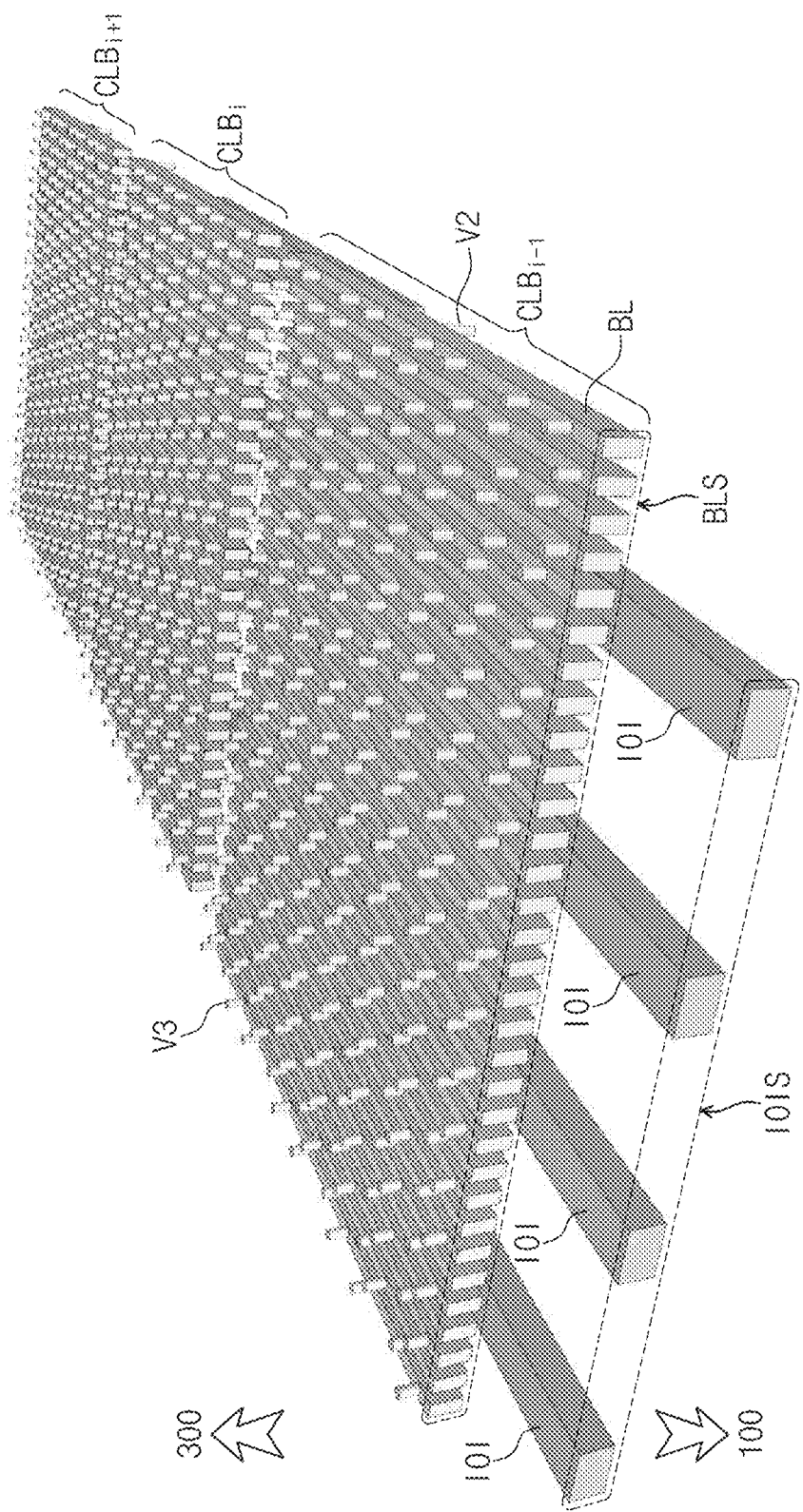
FIGS. 14 and 15 are schematic perspective views of a lower wiring structure according to exemplary embodiments of the inventive concept.

FIG. 13 is a sectional view schematically illustrating an example of dispositions of the lower wiring structure (200 of FIG. 1) relative to the column blocks $CLB_1$, $CLB_2$, ..., $CLB_n$, according to exemplary embodiments of the inventive concept. FIG. 14 is a schematic perspective view of the lower wiring structure according to exemplary embodiments of the inventive concept, and FIG. 15 is an inverted view of the lower wiring structure of FIG. 14.

Referring to FIG. 13, the lower wiring structure 200 may include at least one I/O line structure IOIS provided below the memory structure 300 and a plurality of bit line structures BLS interposed between the I/O line structure IOIS and the memory structure 300.

Figure 15:
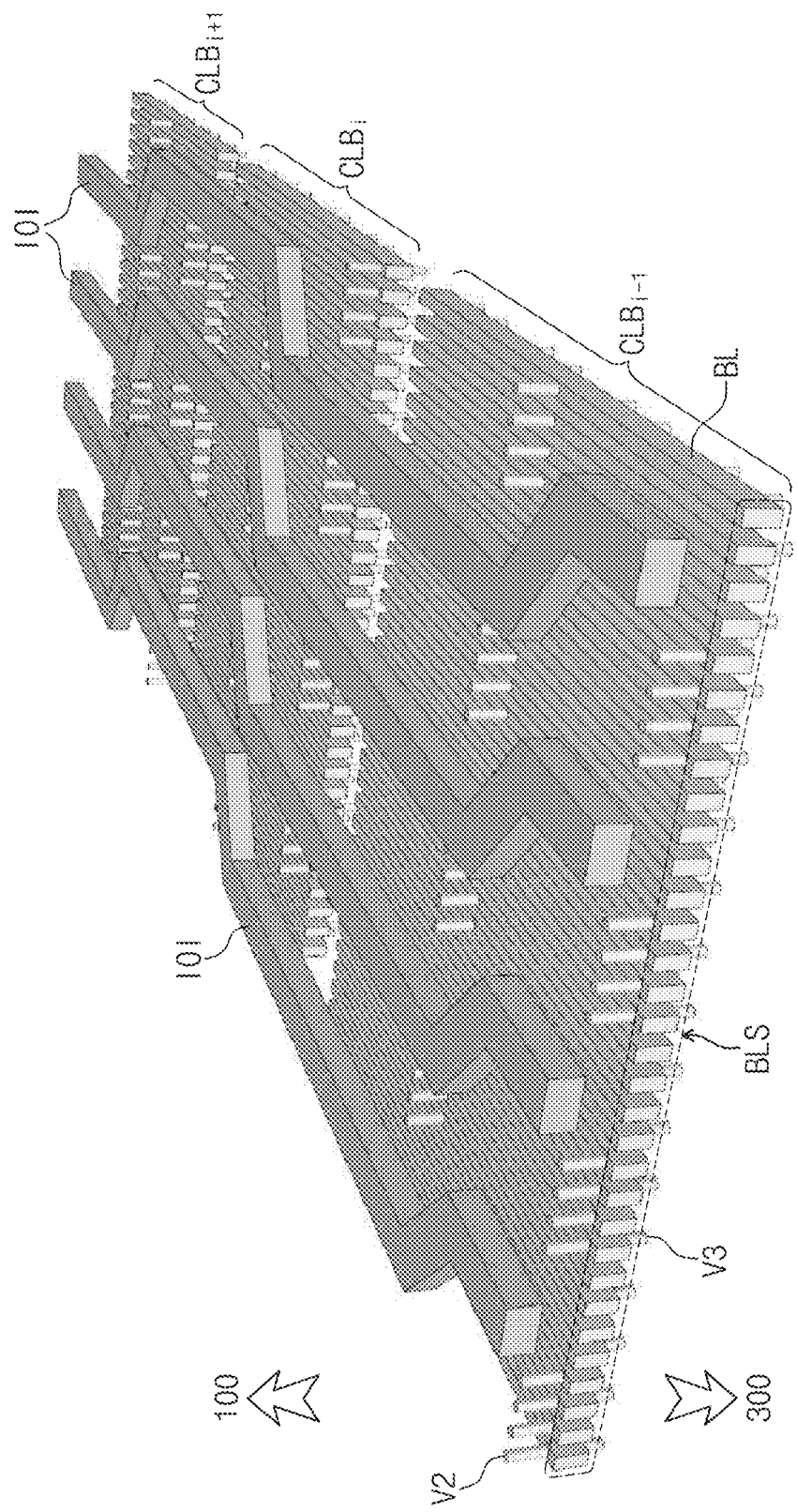

As shown in FIGS. 13 through 15, each of the bit line structures BLS may include a plurality of bit lines BL provided on a corresponding one of the column blocks $CLB_1$, $CLB_2$, ..., $CLB_n$. Each of the bit lines BL may be electrically connected to the R/W circuit C5 in the corresponding one of the column blocks $CLB_1$, $CLB_2$, ..., $CLB_n$ through at least one second via plug V2. In addition, each of the bit lines BL may be electrically connected to the memory structure 300 through a plurality of third via plugs V3.

The I/O line structure 101S may include a plurality of I/O lines IOI crossing plural ones or all of the column blocks $CLB_1$, $CLB_2$, ..., $CLB_n$. Each of the I/O lines IOI may be connected in common to the column selection circuits C4 of the column blocks $CLB_1$, $CLB_2$, ..., $CLB_n$.

As shown in FIGS. 14 and 15, each of the I/O lines IOI may be configured to have a cross-sectional area that is larger than that of the bit line BL. For example, each of the I/O lines IOI may have both a greater thickness and a greater depth than each of the bit lines BL. In addition, as shown in FIG. 15, each of the I/O lines IOI may have a curved or bent portion to allow the bit lines BL to be electrically connected to the column blocks $CLB_1$, $CLB_2$, ..., $CLB_n$ without the necessity for an extra connection region.

Figure 16:
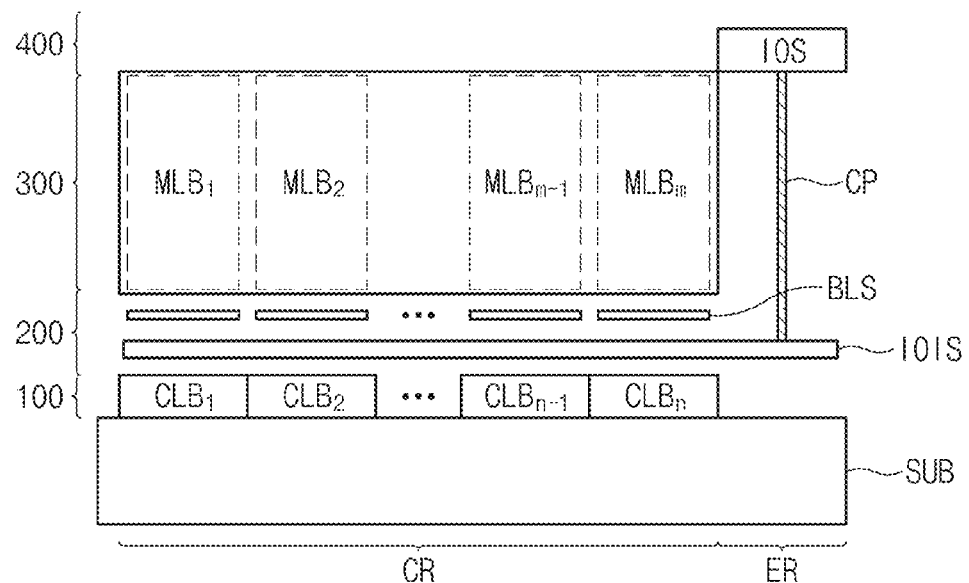
FIGS. 16, 17 and 18 are schematic sectional views illustrating dispositions of column blocks relative to memory blocks, according to respective exemplary embodiments of the inventive concept.
Figure 17:
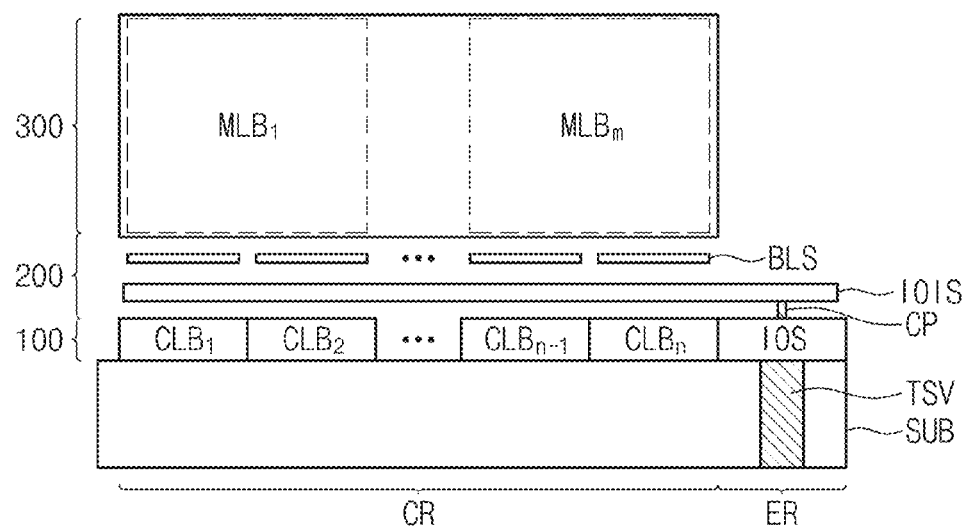
Figure 18:
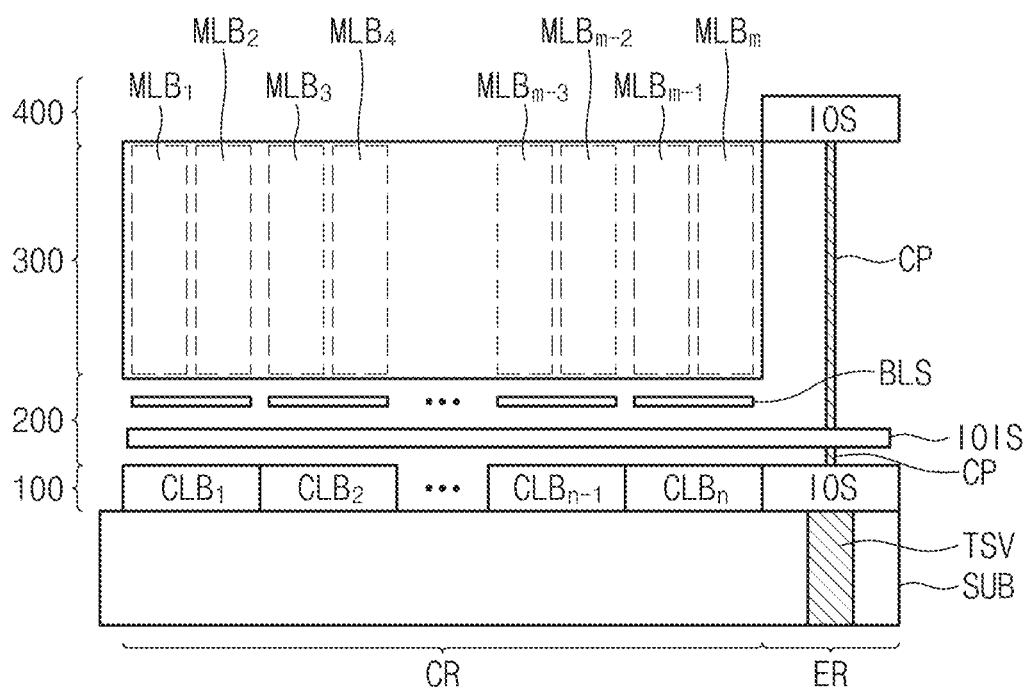

FIGS. 16 through 18 are schematic sectional views illustrating dispositions of memory blocks relative to column blocks, according to exemplary embodiments of the inventive concept. Each of the memory array tiles MT of the memory structure 300 may include a plurality of memory blocks $MBL_1$, $MBL_2$, ..., $MBL_m$. As will be shown by the examples below, the memory blocks $MBL_1$, $MBL_2$, ..., $MBL_m$ may be configured in such a way that the number (i.e., m) thereof in each of the memory array tiles MT is equal to, less than, or larger than the number (i.e., n) of column blocks $CLB_1$, $CLB_2$, ..., $CLB_n$.

That is, in the example of FIG. 16, the number m of memory blocks $MBL_1$, $MBL_2$, ..., $MBL_m$ constituting each of the memory array tiles MT is equal to the number n of column blocks $CLB_1$, $CLB_2$, ..., $CLB_n$. In this case, each of the bit line structures BLS may be provided to span a corresponding one of the memory blocks $MBL_1$, $MBL_2$, ..., $MBL_m$. For instance, the memory cells constituting each of the memory blocks $MBL_1$, $MBL_2$, ..., $MBL_m$ may be electrically connected to the corresponding one of the column blocks $CLB_1$, $CLB_2$, ..., $CLB_n$ through the corresponding one of the bit line structures BLS.

In the example shown in FIG. 17, the number m of memory blocks $MBL_1$, $MBL_2$, ..., $MBL_m$ constituting each of the memory array tiles MT is less than the number n of column blocks $CLB_1$, $CLB_2$, ..., $CLB_n$. In this case, each of the memory blocks $MBL_1$, $MBL_2$, ..., $MBL_m$ may be provided to span at least two corresponding bit line structures BLS. For example, each of the memory blocks $MBL_1$, $MBL_2$, ..., $MBL_m$ may be electrically connected to at least two of the bit line structures BLS, each of which is connected to a corresponding one of the column blocks $CLB_1$, $CLB_2$, ..., $CLB_n$.

In the example shown in FIG. 18, the number m of memory blocks $MBL_1$, $MBL_2$, ..., $MBL_m$ constituting each of the memory array tiles MT is larger than the number n of column blocks $CLB_1$, $CLB_2$, ..., $CLB_n$. In this case, each of the bit line structures BLS may be provided to span at least two corresponding memory blocks $MBL_1$, $MBL_2$, ..., $MBL_m$. For example, at least two of the memory blocks $MBL_1$, $MBL_2$, ..., $MBL_m$ may be electrically connected in common to a corresponding one of the bit line structures BLS, each of which is connected to a corresponding one of the column blocks $CLB_1$, $CLB_2$, ..., $CLB_n$.

Meanwhile, as shown in FIGS. 16 through 18, the I/O lines IOI may be electrically connected to the I/O structure IOS, which may be provided in and/or on the exposed region ER. For example, as shown in FIG. 16, the I/O structure IOS may be a portion of the upper wiring structure 400, which may be positioned over on the exposed region ER, and in this case, the I/O lines IOI may be electrically connected to the I/O structure IOS through conductive plugs CP, which may be located adjacent the memory structure 300.

Alternatively, as shown in FIG. 17, the I/O structure IOS may be a portion of the CMOS structure 100 located in the exposed region ER, and in this case, the I/O lines IOI may be electrically connected to the I/O structure IOS through conductive plugs CP, which also may be located on a portion of the CMOS structure 100.

Furthermore, as shown in FIG. 18, the I/O structure IOS may include a portion of the CMOS structure 100 located in the exposed region ER and a portion of the upper wiring structure 400 located over the exposed region ER, and in this case, the I/O lines IOI may be electrically connected to the I/O structure IOS through the conductive plugs CP, which may be located adjacent the memory structure 300 and on a portion of the CMOS structure 100.

As shown in FIGS. 17 and 18, in the case where the I/O structure IOS is provided as a portion of the CMOS structure 100, through vias (e.g., through-silicon via; TSV) may be provided to connect the I/O structure IOS electrically to an external electronic device through the substrate SUB.

FIGS. 19 through 28 are sectional views for reference in describing a process of fabricating a 3D semiconductor device, according to exemplary embodiments of the inventive concept. Among these views, FIGS. 19, 21, 23, 25, and 27 are vertical sectional views parallel to a bit line direction, where CLBi−1 and CLBi denote column blocks described above. The remaining views of FIGS. 20, 22, 24, 26, and 28 are vertical sectional views perpendicular to the bit line direction, where CR denotes a covered region described above and ER0 denotes an intermediate exposed region described above.

Figure 19:
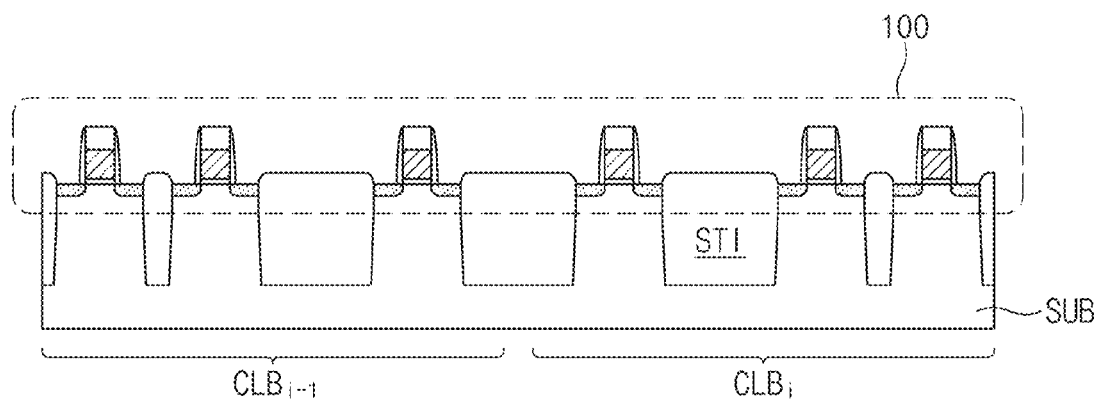
FIGS. 19, 20, 21, 22, 23, 24, 25, 26, 27 and 28 are sectional views for reference in describing a process of fabricating a 3D semiconductor device, according to exemplary embodiments of the inventive concept.
Figure 20:
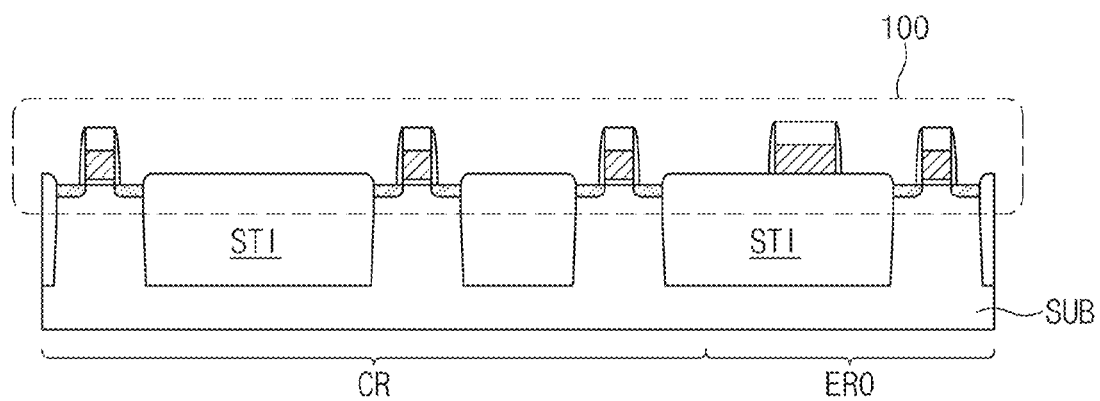

Referring to FIGS. 19 and 20, device isolation layers STI may be formed in the substrate SUB to define active regions, and then, transistors may be integrated on the active regions. The transistors may include n- and p-type metal-oxide-semiconductor (MOS) transistors constituting the CMOS structure 100.

Figure 21:
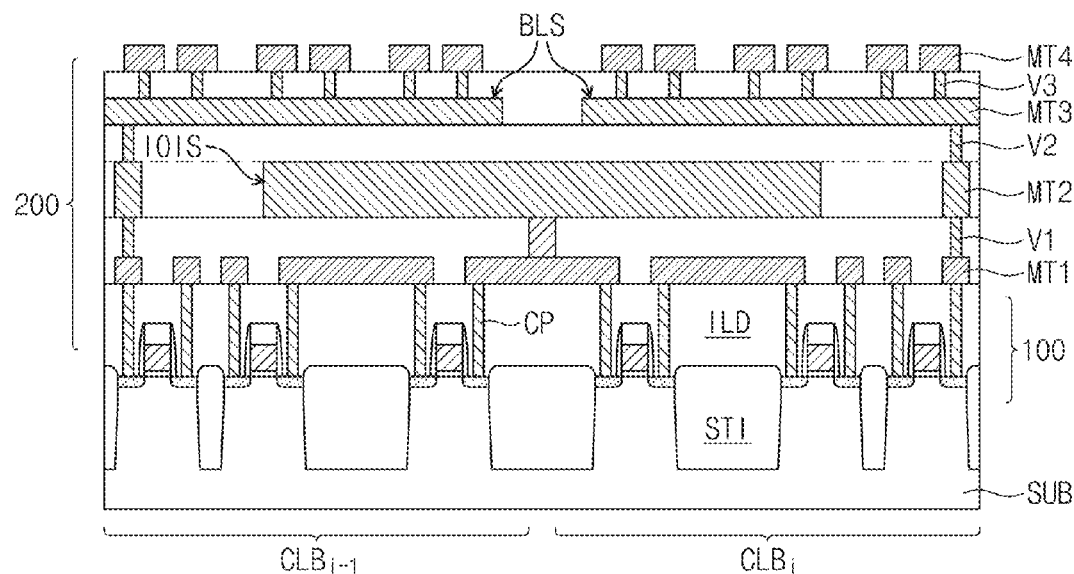
Figure 22:
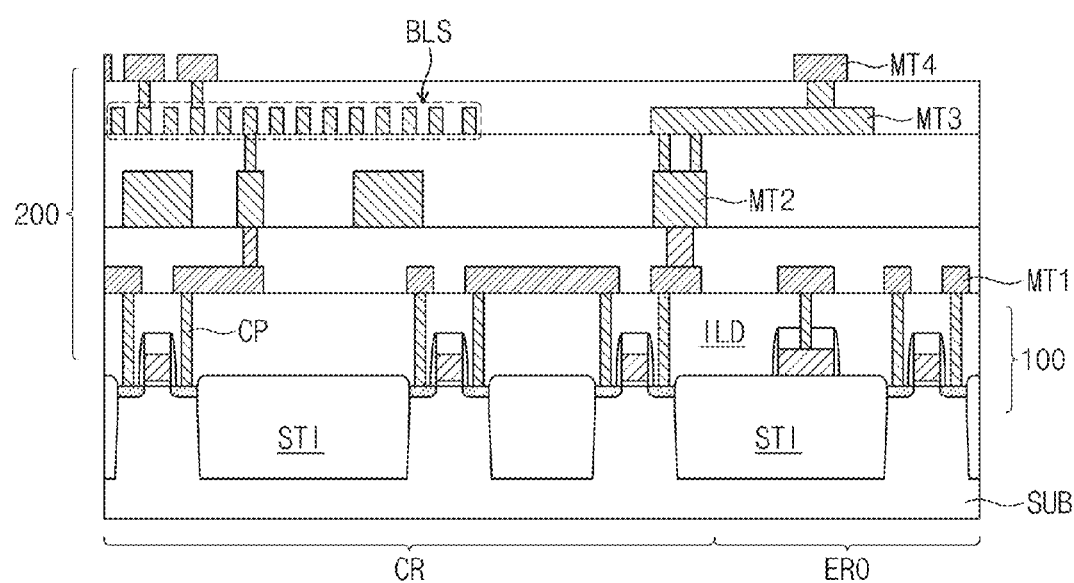

Referring to FIGS. 21 and 22, the lower wiring structure 200 may be formed on the CMOS structure 100 and may be electrically connected to the CMOS structure 100. For example, the lower wiring structure 200 may include a plurality of metal layers, which are formed at different levels, and conductive plugs for connecting them electrically to each other. In example embodiments, the lower wiring structure 200 may include first, second, and third metal patterns MT1, MT2, and MT3. Furthermore, the lower wiring structure 200 may further include contact plugs connecting the first metal patterns MT1 to the transistors, first via plugs V1 vertically connecting the first and second metal patterns MT1 and MT2 to each other, and second via plugs V2 vertically connecting the second and third metal patterns MT2 and MT3 to each other. The third metal patterns MT3 may serve as the bit line structures BLS or the bit lines BL, and the second metal patterns MT2 may serve as the I/O line structure IOIS or the I/O lines 101.

However, in other embodiments, the lower wiring structure 200 may be configured to realize the I/O line structure IOIS and the bit line structures BLS using the first and second metal patterns MT1 and MT2. For example, the I/O line structure IOIS or the I/O lines 101 may be realized using the first metal patterns MT1 directly connected to the contact plugs, and the bit line structures BLS or the bit lines BL may be realized using the second metal patterns MT2.

In still other embodiments, the lower wiring structure 200 may further include conductive pads for allowing the bit line structures BLS to be easily connected to the memory structure 300. For example, as shown in FIGS. 21 and 22, the lower wiring structure 200 may further include fourth metal patterns MT4 serving as the conductive pads. In certain embodiments, the conductive pads may be formed of highly-doped semiconductor patterns rather than a metallic material.

Figure 23:
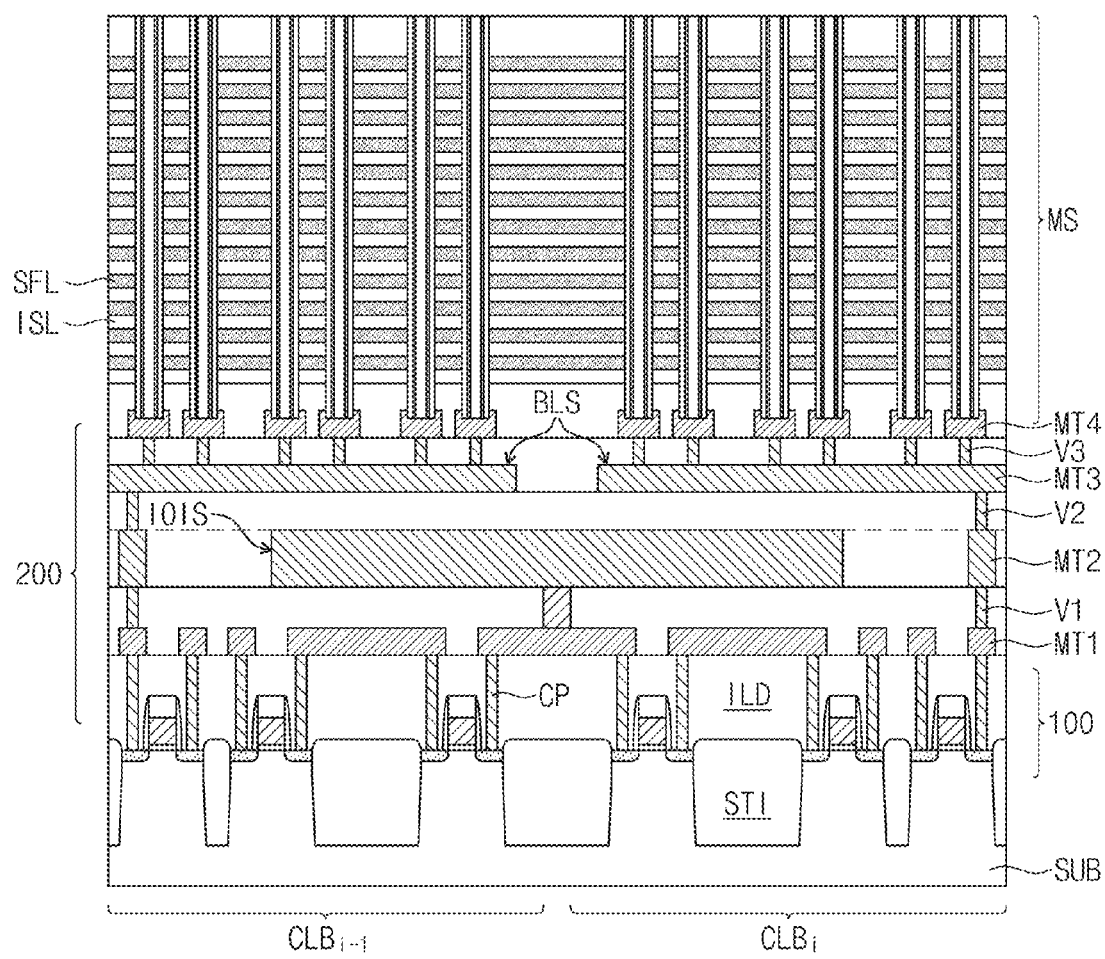
Figure 24:
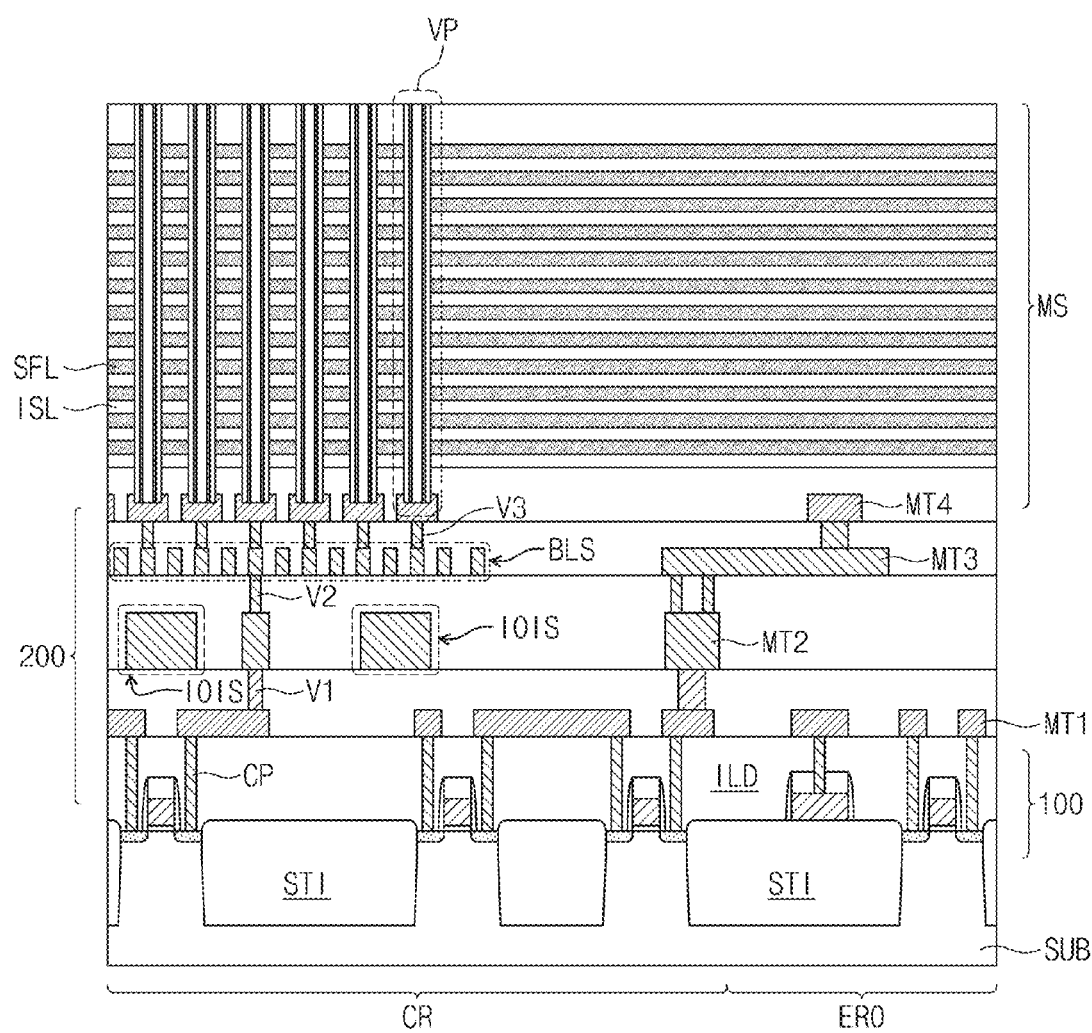

Referring to FIGS. 23 and 24, a mold structure MS may be formed on the lower wiring structure 200, and then, vertical patterns VP may be formed to penetrate the mold structure MS. The mold structure MS may be a multi-layered structure including a plurality of insulating layers ISL and a plurality of sacrificial layers SFL that are alternatingly stacked on the lower wiring structure 200.

The vertical patterns VP may be configured to provide vertical current paths to memory cells and include a semiconductor or conductive material. The vertical patterns VP may be two-dimensionally arranged on the lower wiring structure 200. The vertical patterns VP may be electrically connected to the bit lines BL through, for example, the fourth metal patterns MT4 and the third via plugs V3. In example embodiments, a plurality of vertical patterns VP may be connected in common to each of the bit lines BL.

In example embodiments, each of the vertical patterns VP may have a multi-layered structure. For example, each of the vertical patterns VP may include a semiconductor layer and at least one insulating layer. Further, the at least one insulating layer of the vertical patterns VP may be configured to realize a memory function or serve as a storage element. For example, the vertical pattern VP may include a semiconductor layer and at least one of a tunnel insulating layer, a charge storing layer, and a blocking insulating layer. Some examples of structures of the vertical pattern VP will be described later in more detail with reference to FIGS. 31 through 34.

Figure 25:
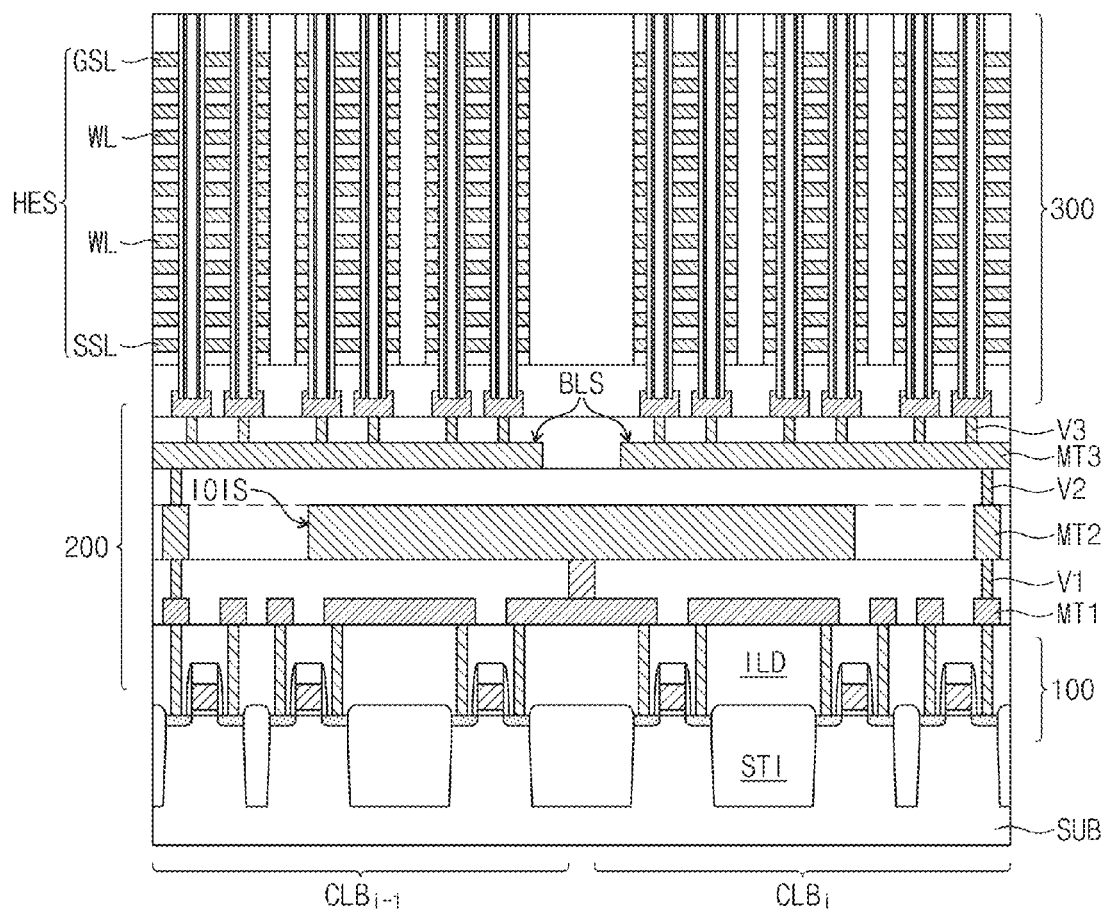
Figure 26:
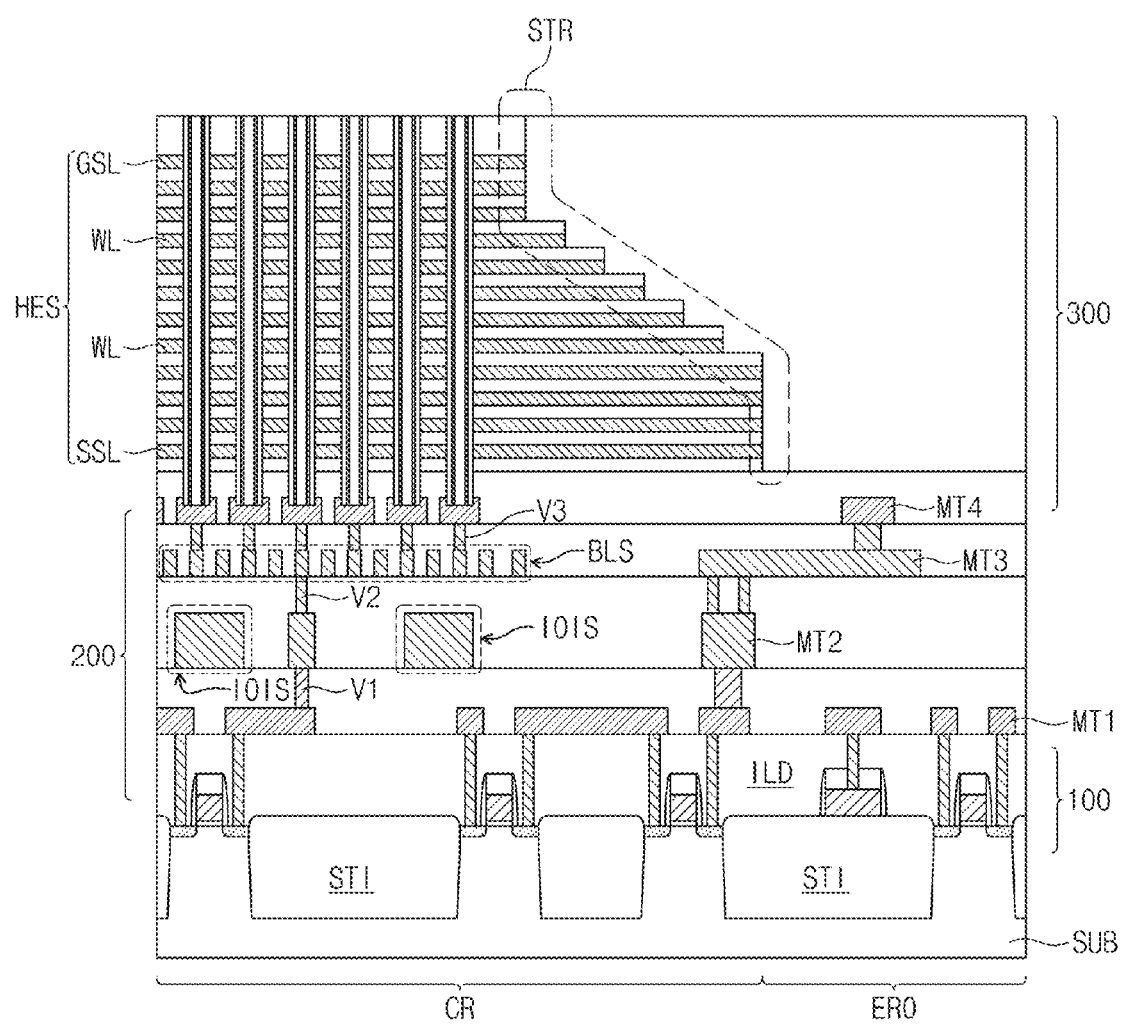

Referring to FIGS. 25 and 26, a horizontal structure HES may be formed on the lower wiring structure 200. The horizontal structure HES may include a plurality of horizontal patterns that are sequentially stacked on the lower wiring structure 200. The formation of the horizontal structure HES may include patterning the mold structure MS to form trenches crossing the bit lines BL, removing the sacrificial layers SFL exposed by the trenches to form inter-layered gap regions exposing the vertical patterns VP, and then, filling the inter-layered gap regions with a conductive layer.

As shown in FIG. 26, the horizontal structure HES may be formed to have a staircase portion STR. For example, the staircase portion STR may be formed on an edge region of the covered region CR adjacent to the intermediate exposed region ER0. The staircase portion STR may be formed by a stepwise-patterning process, which may be performed before or after forming the conductive layer for the horizontal structure HES. For example, in the case where the stepwise-patterning process is performed before the formation of the conductive layer, the stepwise-patterning process may include a plurality of etching steps to be performed on the mold structure MS. Alternatively, in the case where the stepwise-patterning process is performed after the formation of the conductive layer, the stepwise-patterning process may include a plurality of etching steps to be performed on the conductive layer.

The horizontal structure HES and the vertical patterns VP may constitute the memory structure 300. In example embodiments, the horizontal structure HES may include ground selection lines GSL provided so as to be spaced apart from the lower wiring structure 200, string selection lines SSL provided between the ground selection lines GSL and the lower wiring structure 200, and a plurality of word lines WL provided between the string selection lines SSL and the ground selection lines GSL to form a multi-layered structure. Similar to the word lines WL, the string selection lines SSL and/or the ground selection lines GSL may be formed to have a multi-layered structure. Some examples of structures of the horizontal pattern of the horizontal structure HES will be described later in more detail with reference to FIGS. 31 through 34.

Figure 27:
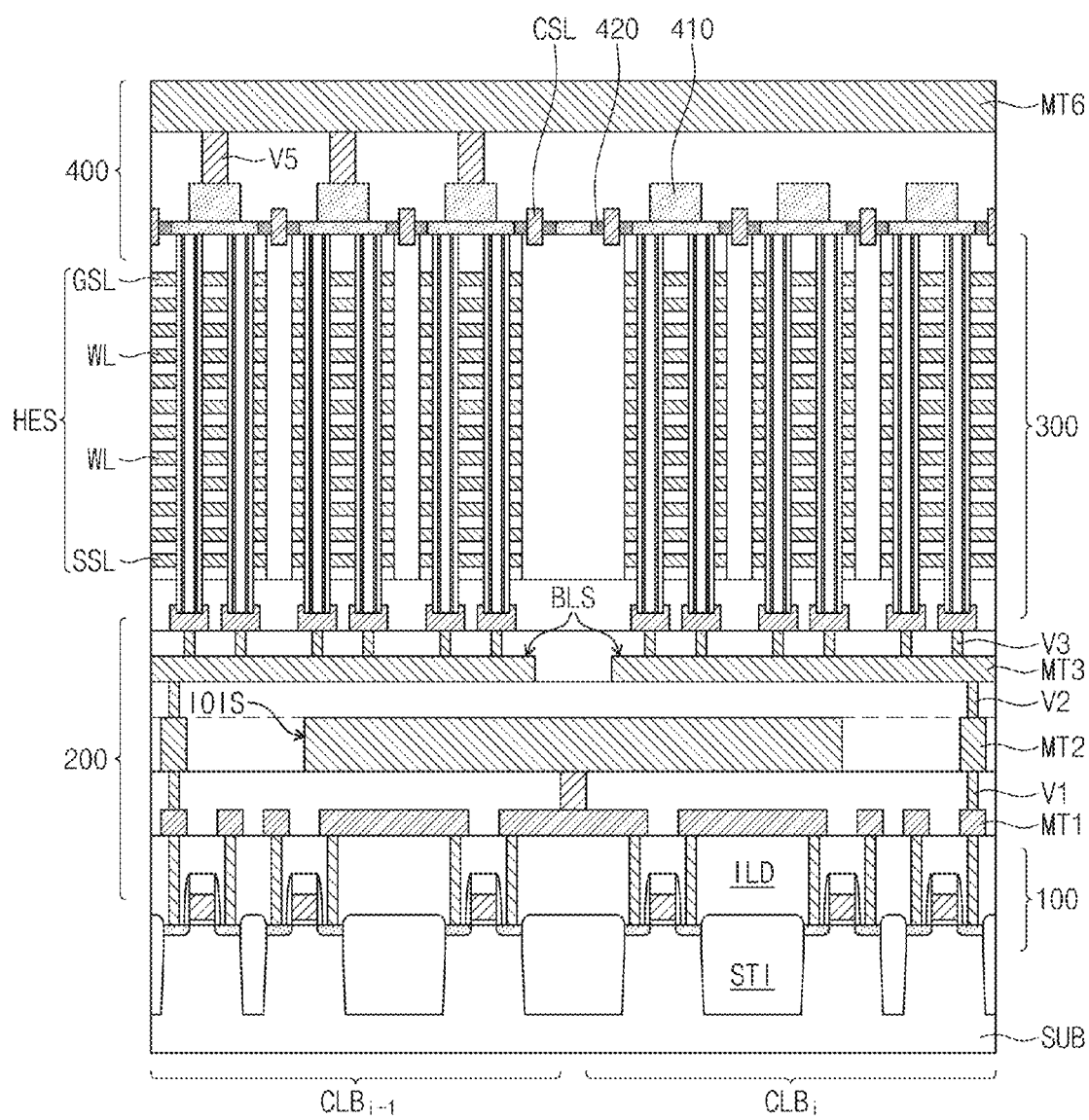
Figure 28:
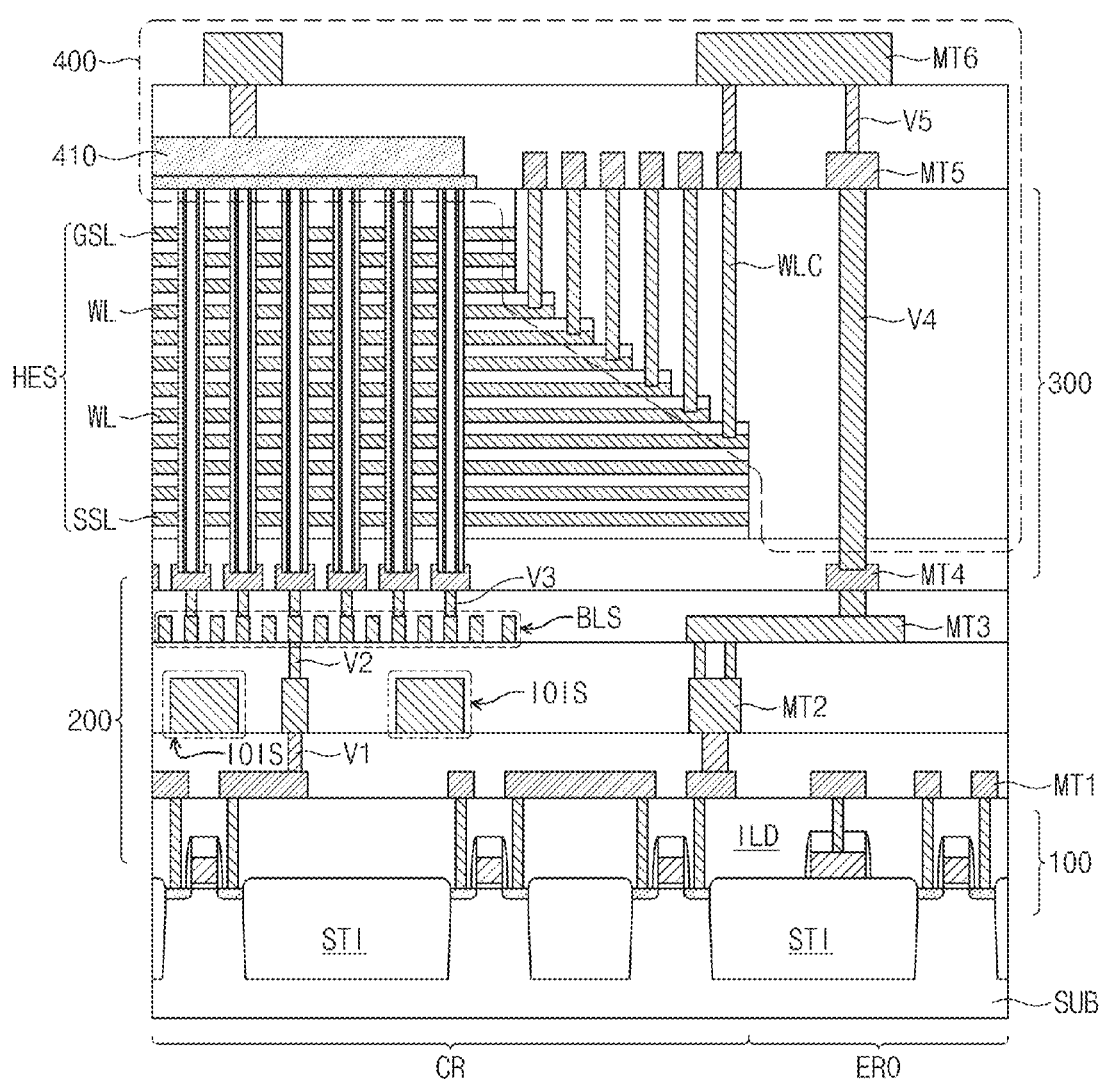

Referring to FIGS. 27 and 28, the upper wiring structure 400 may be formed on the memory structure 300. The upper wiring structure 400 may include first and second upper metal patterns MT5 and MT6 that are sequentially stacked on the horizontal structure HES. In addition, the upper wiring structure 400 may further include fourth via plugs V4 connecting the first upper metal patterns MT5 electrically to the CMOS structure 100, and fifth via plugs V5 connecting the first and second upper metal patterns MT5 and MT6 electrically to each other.

As shown in FIG. 28, the first upper metal patterns MT5 may be connected to the staircase portion STR of the horizontal structure HES through word line contacts WLC. In example embodiments, the word line contacts WLC may be formed in a process in which the fourth via plugs V4. In other embodiments, the word line contacts WLC may be formed by an additional process performed after or before forming the fourth via plugs V4.

In certain embodiments, as shown in FIG. 27, the first upper metal patterns MT5 may be used as common source lines CSL crossing the bit lines BL. In other embodiments, the common source lines CSL may be formed by an additional process performed after or before forming the first upper metal patterns MT5.

In example embodiments, the first and second upper metal patterns MT5 and MT6 may be electrically connected to the CMOS structure 100 through the fourth via plugs V4 and the lower wiring structure 200.

The upper wiring structure 400 may further include upper semiconductor pattern 410 provided on the vertical patterns VP and impurity regions 420 provided between the upper semiconductor pattern 410 and the common source lines CSL. The impurity regions 420 may be formed to have a different conductivity type from that of the upper semiconductor pattern 410, and the upper semiconductor pattern 410 may be formed to have the same conductivity type as that of the semiconductor material in the vertical patterns VP. Accordingly, the impurity regions 420 and the upper semiconductor pattern 410 may serve as rectifying devices.

In example embodiments, the lower wiring structure 200 may be configured to prevent a process failure (e.g., excessive expansion or hillock) from occurring, even at the highest temperature (hereinafter, referred as to a 'process critical temperature') in a process of forming the memory structure 300 or the upper semiconductor pattern 410. In other words, the lower wiring structure 200 may be formed of materials exhibiting favorable heat-resistant properties at the process critical temperature. For example, the first to third via plugs V1, V2, and V3 and the first to third metal patterns MT1, MT2, and MT3 may be formed of materials (e.g., tungsten), whose melting points are higher than the process critical temperature.

In the meantime, metallic patterns constituting the upper wiring structure 400 may be formed of at least one material having an electrical resistivity lower than that of conductive patterns constituting the lower wiring structure 200. For example, a low resistivity material, such as copper or aluminum, may be used for at least one of the metallic patterns of the upper wiring structure 400. Although copper or aluminum may result in a process failure even at a lower temperature than the process critical temperature, it is possible to realize the upper wiring structure 400 with the material having a low melting point and low resistivity, because the formation of the upper wiring structure 400 is performed after the formation of the memory structure 300 or the upper semiconductor pattern 410.

Figure 29:
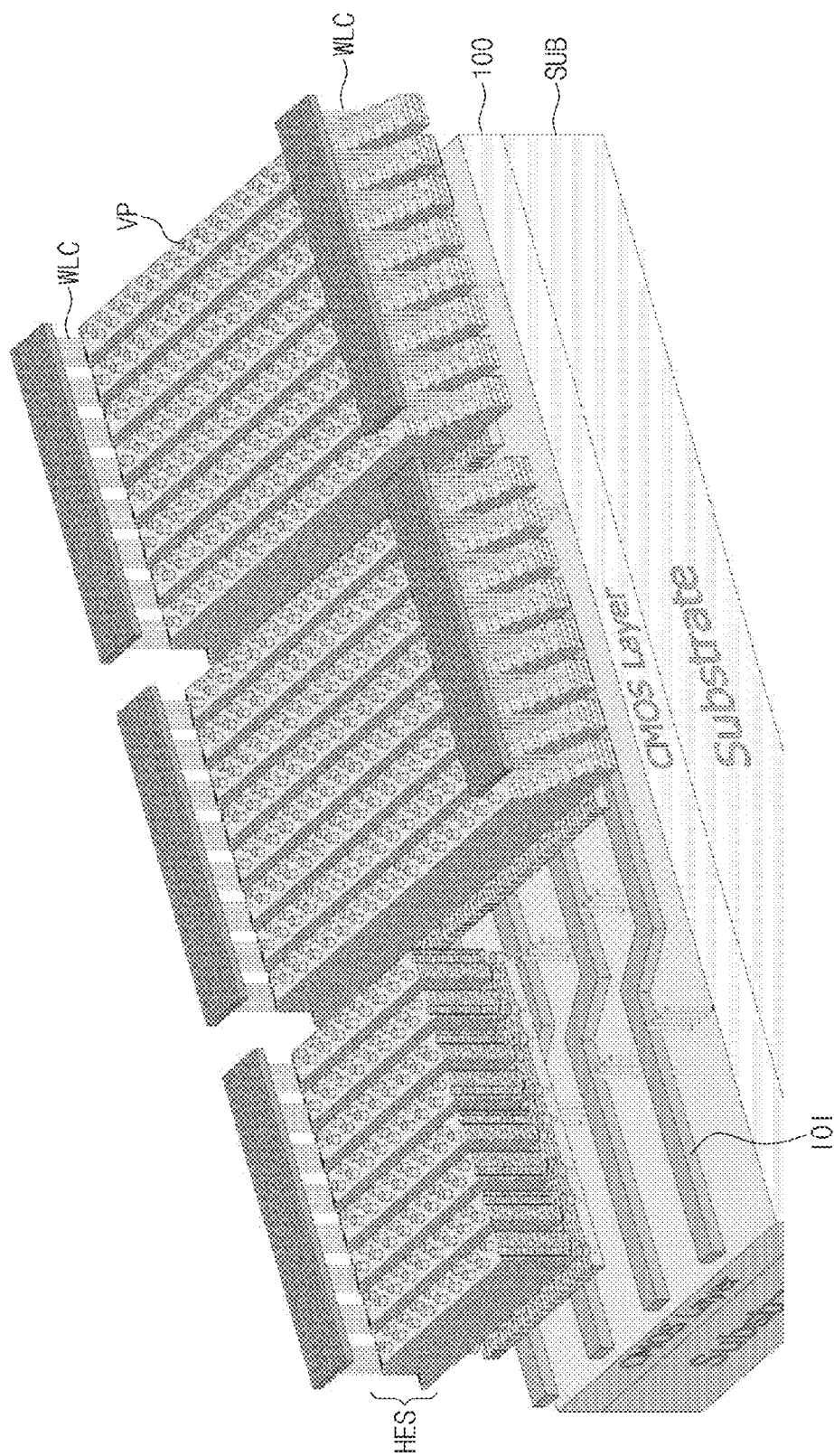
FIGS. 29 and 30 are perspective views schematically illustrating an example of 3D semiconductor devices according to exemplary embodiments of the inventive concept.
Figure 30:
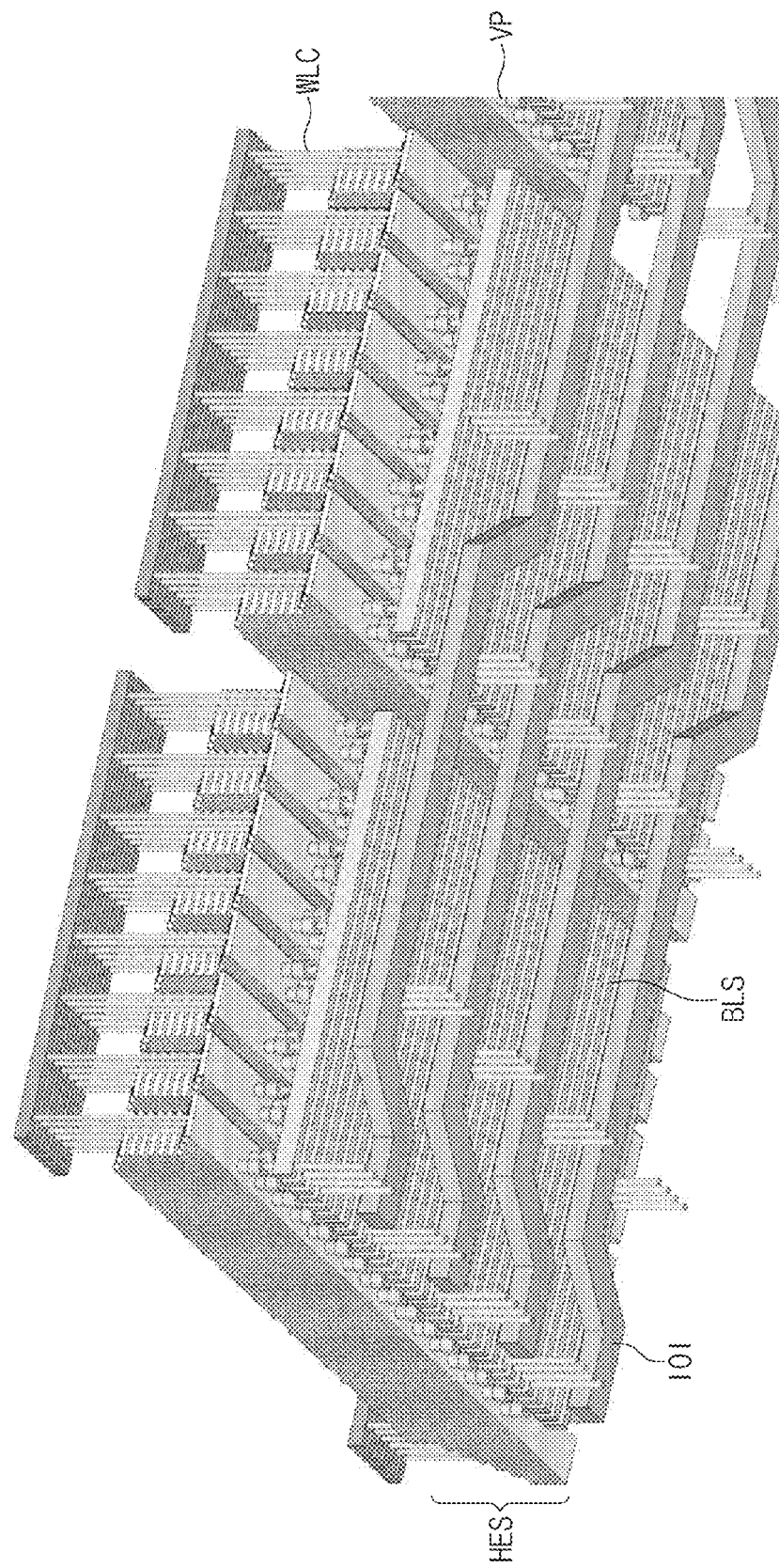

Perspective views of a 3D semiconductor device fabricated by the afore-described fabricating method are shown in FIGS. 29 and 30, where FIG. 30 is an inverted view of FIG. 29 but without the CMOS structure 100 and substrate SUB of FIG. 29. In order to reduce complexity of the drawings and to facilitate understanding of example embodiments of the inventive concept, some elements (e.g., insulating layers) of the 3D semiconductor device are omitted in FIGS. 29 and 30. Those of ordinary skill in the art with knowledge of example embodiments will understand which elements may be omitted from both the accompanying drawings and descriptions of fabricating methods.

FIGS. 31 through 34 are sectional views illustrating examples of a portion of 3D vertical NAND FLASH memory devices, according to exemplary embodiments of the inventive concept.

Example embodiments of the inventive concept may be applied to realize a 3D charge-trap NAND FLASH memory device. For example, the horizontal structure HES may include the horizontal patterns HP that are vertically separated by an interlayered dielectric ILD, as shown in FIGS. 31 through 34, and each of the vertical patterns VP and each of the horizontal patterns HP may constitute one of unit memory cells that will be described with reference to FIGS. 31 through 34.

The 3D charge-trap NAND FLASH memory device of example embodiments may include three-dimensionally arrayed memory cells. In each memory cell, the vertical pattern VP may include a semiconductor pattern SP serving as a channel region, and the horizontal pattern HP may include a horizontal electrode WL serving as a gate electrode or a word line. In example embodiments, the vertical pattern VP may further include a vertical insulating layer VI that is inserted into the semiconductor pattern SP. Furthermore, each of the memory cells may further include a tunnel insulating layer TL, a charge storing layer CL, and a blocking insulating layer BK that constitute a memory element.

Figure 31:
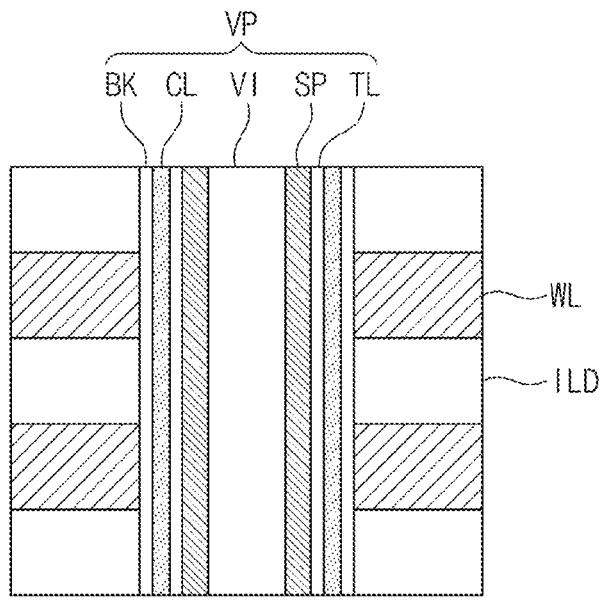
FIGS. 31, 32, 33 and 34 are sectional views illustrating examples of a portion of 3D vertical NAND FLASH memory devices, according to exemplary embodiments of the inventive concept.
Figure 32:
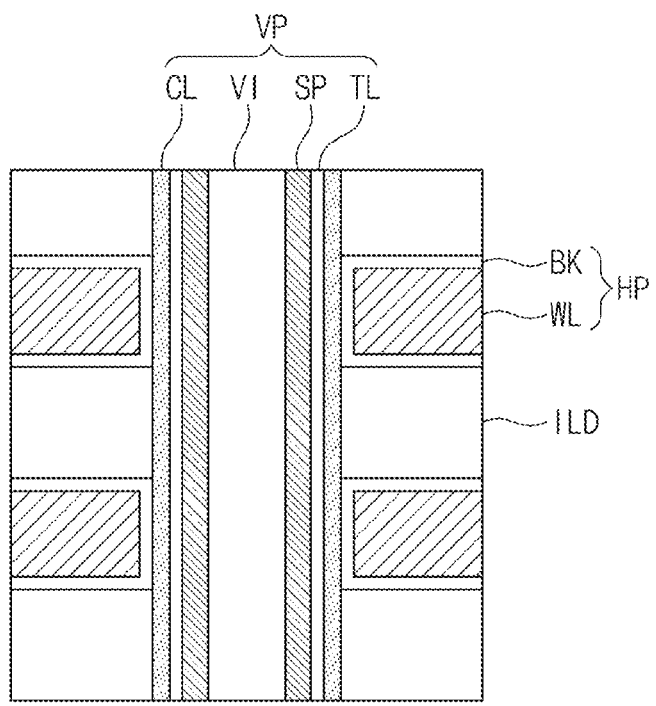
Figure 33:
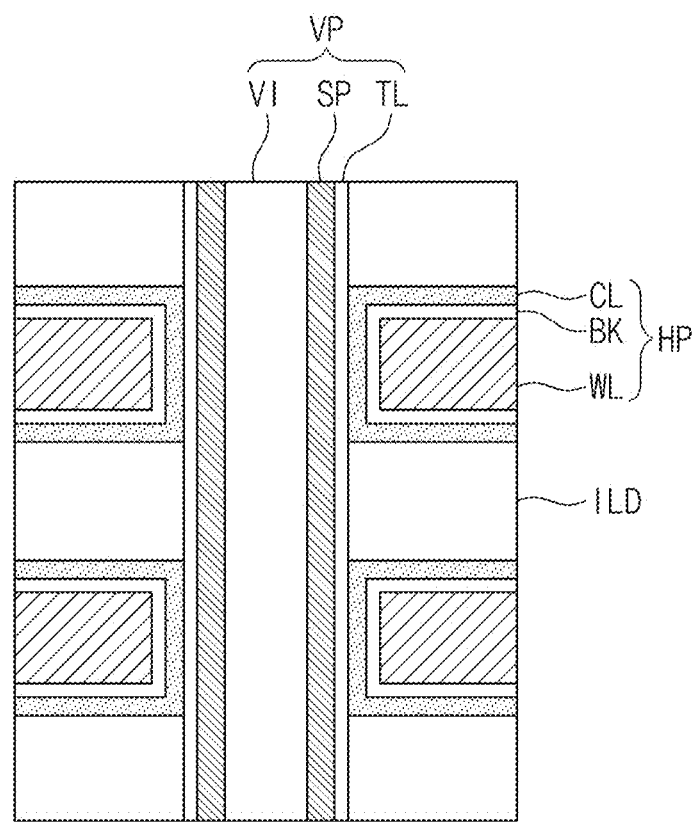
Figure 34:
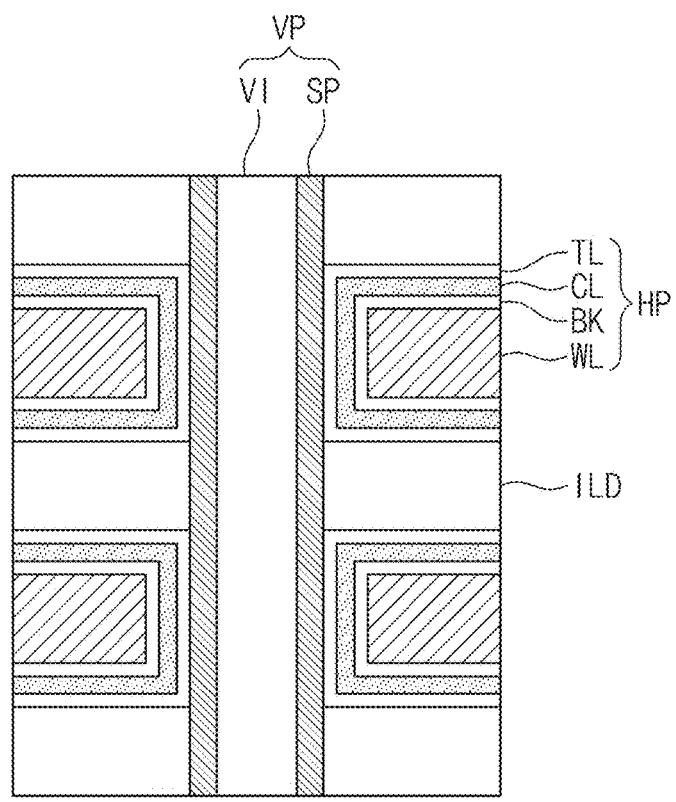

In the example shown in FIG. 31, the tunnel insulating layer TL, the charge storing layer CL, and the blocking insulating layer BK constitute the vertical pattern VP. In the example shown in FIG. 34, the tunnel insulating layer TL, the charge storing layer CL, and the blocking insulating layer BK constitute the horizontal pattern HP. In the example shown in FIG. 32, the tunnel insulating layer TL and the charge storing layer CL constitute the vertical pattern VP, and the blocking insulating layer BK constitutes the horizontal pattern HP. In the example shown in FIG. 33, the tunnel insulating layer TL constitutes the vertical pattern VP, and the charge storing layer CL and the blocking insulating layer BK constitute the horizontal pattern HP. It will be understood, however, that example embodiments of the inventive concept are not be limited to the examples shown in FIGS. 31 through 34. For example, at least one of the tunnel insulating layer TL, the charge storing layer CL, and the blocking insulating layer BK may be provided in a multi-layered structure. Furthermore, the multi-layered structure may be configured to include layers, at least one of which is included in the vertical pattern VP and the other of which is included in the horizontal pattern HP.

The charge storing layer CL may be one of an insulating layer with many trap sites and an insulating layer with nano particles, and be formed by one of a chemical vapor deposition or atomic layer deposition process. For example, the charge storing layer CL may include one of a trap insulating layer, a floating gate electrode, or an insulating layer with conductive nano dots. In example embodiments, the charge storing layer CL may include at least one of a silicon nitride layer, a silicon oxynitride layer, a silicon-rich nitride layer, a nanocrystalline silicon layer, or a laminated trap layer.

The tunnel insulating layer TL may be one of materials having a greater band gap than the charge storing layer CL, and be formed by one of a chemical vapor deposition or atomic layer deposition process. For example, the tunnel insulating layer TL may be a silicon oxide layer, which may be formed using one of the previously mentioned deposition techniques. Furthermore, a thermal treatment process may be further performed on the tunnel insulating layer TL, for example, after the deposition thereof. The thermal treatment may be a rapid thermal nitridation (RTN) process or an annealing process to be performed under an atmosphere containing at least one of nitrogen and oxygen.

The blocking insulating layer BK may include first and second blocking insulating layers that are formed of different materials from each other. In example embodiments, one of the first and second blocking insulating layers may be configured to have a band gap that is smaller than that of the tunnel insulating layer TL and higher than that of the charge storing layer CL. Further, the first and second blocking insulating layers may be formed using a chemical vapor deposition or an atomic layer deposition, and one of them may be formed by a wet oxidation process. In example embodiments, the first blocking insulating layer may be one of high-k dielectrics, such as aluminum oxide and hafnium oxide, and the second blocking insulating layer may be a material whose dielectric constant is smaller than the first blocking insulating layer. In other embodiments, the second blocking insulating layer may be one of high-k dielectrics, and the first blocking insulating layer may be a material, whose dielectric constant is smaller than the second blocking insulating layer.

Figure 35:
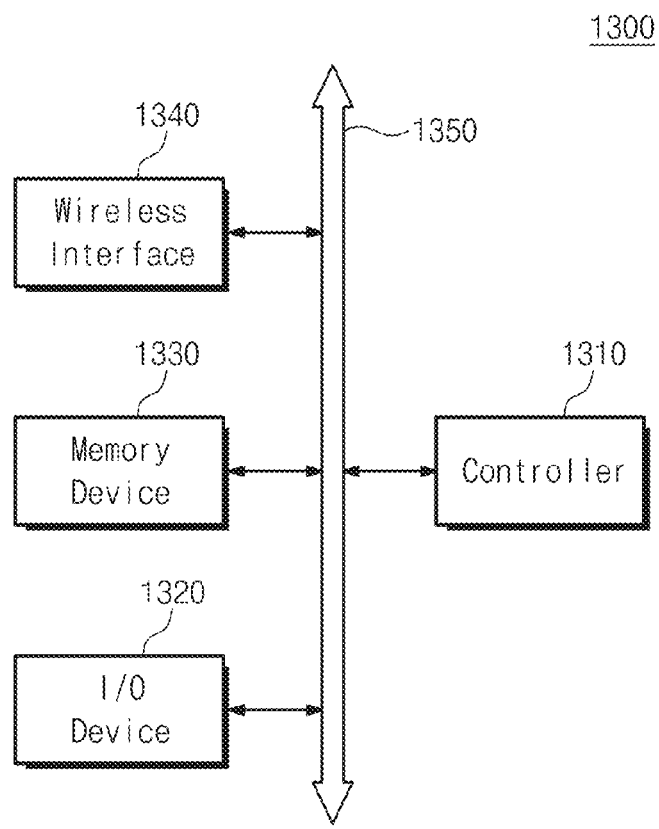
FIGS. 35 and 36 are block diagrams illustrating examples of electronic devices which may be fabricated to include a semiconductor device according to one or more example embodiments of the inventive concept.
Figure 36:
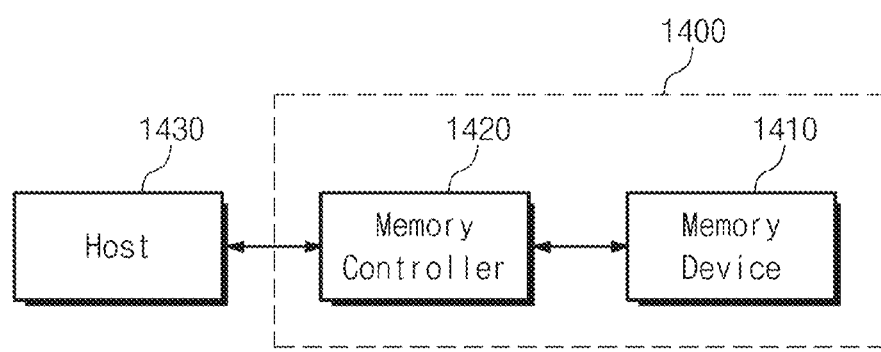

FIGS. 35 and 36 are block diagrams schematically illustrating examples of electronic devices which incorporate a semiconductor device according to one or more example embodiments of inventive concept.

Referring to FIG. 35, an electronic device 1300 may be one of a personal digital assistant (PDA), a laptop computer, a mobile computer, a web tablet, a wireless phone, a cell phone, a digital music player, a wire or wireless electronic device, or a complex electronic device including at least two of these listed devices. The electronic device 1300 may include a controller 1310, an input/output device 1320 such as a keypad, a keyboard, a display, a memory 1330, and a wireless interface 1340 that communicate with each other through a bus system 1350. The controller 1310 may include, for example, at least one of a microprocessor, a digital signal processor, and a microcontroller or the like. The memory 1330 may be configured to store a command code to be used by the controller 1310 or a user data. The memory 1330 may include a semiconductor device according to one or more example embodiments of inventive concept. The electronic device 1300 may use the wireless interface 1340 to transmit data to or receive data from a wireless communication network using a RF signal. The wireless interface 1340 may include, for example, an antenna, a wireless transceiver and so on. The electronic system 1300 may operate in accordance with a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 36, a memory system including a semiconductor device according to one or more example embodiments of inventive concept will now be described. The memory system 1400 may include a memory device 1410 for storing massive amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to one or more example embodiments of inventive concept.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to one or more example embodiments of the inventive concept, a plurality of column blocks may be provided below a memory structure. At least one or all of the column blocks may be configured to independently execute a read or write operation. By virtue of independent operations of the column blocks, a 3D semiconductor memory device with increased page depth may be realized.

Furthermore, since the column blocks are provided below, not around, the memory structure, a ratio of an occupying area of the memory structure to the total area of the 3D semiconductor memory device may be increased when compared with the conventional chip structures. This allows the 3D semiconductor memory device to have a relatively high memory capacity.

Similarly, it is possible to increase a ratio of an occupying area of the peripheral circuit (for example, the column blocks) to the total area of the 3D semiconductor memory device. For example, the peripheral circuit may be integrated to occupy substantially the entire top surface of the 3D semiconductor memory device. By virtue of such an increase in the occupying area of the peripheral circuit, the peripheral circuit can be readily designed to have various functions and improved performance.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional (3D) semiconductor memory device, comprising:
 a CMOS circuit structure including a plurality of peripheral structures each comprising a plurality of page buffer circuits;
 a lower wiring structure over the CMOS circuit structure; and
 a memory structure including a plurality of horizontal patterns extending parallel to one another in a first direction and spaced from one another at a pitch in a second direction perpendicular to the first direction, the horizontal patterns constituting a plurality memory cells three-dimensionally arranged on the lower wiring structure, wherein the memory structure overlaps the CMOS circuit structure, and wherein the lower wiring structure comprises a plurality of conductive lines extending parallel to one another and spaced from one another at a pitch less than said pitch of the horizontal patterns.

2. The device of claim 1, wherein each of the peripheral structures comprises blocks extending side-by-side within the CMOS circuit structure.

3. The device of claim 2, wherein each of the peripheral structures further comprises a plurality of column selection circuits.

4. The device of claim 3, wherein the blocks of each of the peripheral structures contain a plurality of the page buffer circuits, and a plurality of the column selection circuits, wherein the page buffer circuits occupy rectangular regions, respectively, within the blocks, wherein the column selection circuits occupy rectangular regions within the blocks, respectively, and wherein the rectangular regions occupied by the page buffer circuits extend parallel to the rectangular regions occupied by the column selection circuits within each peripheral structure.

5. The device of claim 3, wherein each of the blocks further comprises at least one of a control logic and a voltage generator.

6. The device of claim 1, wherein the memory structure comprises a plurality of memory blocks, and wherein each of the peripheral structures is aligned below at least one of the memory blocks, respectively.

7. The device of claim 6, wherein the conductive lines are bit lines, respectively, the lower wiring structure includes a plurality of bit line structures located between each peripheral structure and the at least one of the memory blocks aligned below the peripheral structure, and each of the bit line structures comprises a group of the bit lines connected to the respective peripheral structure and to the at least one of the memory blocks.

8. The device of claim 7, wherein the lower wiring structure further comprises input/output (I/O) line structures connecting the bit line structures to each other.

9. The device of claim 8, wherein the CMOS circuit structure is located at a substrate surface that extends horizontally, and the bit line structures and the I/O line structures extend horizontally between the memory structure and the CMOS structure.

10. The device of claim 7, wherein each of the peripheral structures comprises a plurality of blocks containing a plurality of the page buffer circuits, each of the bit line structures is connected to a respective page buffer circuit in the peripheral structures of the CMOS circuit structure, and each of the bit line structures spans a respective one of the blocks.

11. The device of claim 1, further comprising a row selection block contained within the CMOS circuit structure.

12. The device of claim 11, further comprising at least one of a control logic and a voltage generation block contained within the CMOS circuit structure.

13. A three-dimensional (3D) semiconductor memory device, comprising:

a CMOS circuit structure; and a lower wiring structure and a memory structure sequentially stacked over the CMOS circuit structure, wherein the memory structure comprises first and second 3D memory array tiles located over the CMOS circuit structure, each of the 3D memory array tiles comprising memory cells arranged three-dimensionally, the CMOS circuit structure comprises a plurality of peripheral structures located below each of the first and second memory array tiles, the lower wiring structure comprises a plurality of bit line structures including a plurality of bit lines electrically connecting the peripheral structures to the first and second 3D memory array tiles, and the bit lines have a smaller width than a plurality of wirings disposed in the CMOS structure and the memory structure.

14. The device of claim 13, wherein each of the peripheral structures comprises at least one page buffer block and at least one column selection block.

15. The device of claim 13, wherein each of the 3D memory array tiles comprises a plurality of memory blocks, and the peripheral structures are aligned below at least one of the memory blocks, respectively.

16. The device of claim 13, wherein each of the peripheral structures comprises a plurality of blocks arrayed in a given direction, and respective ones of the bit line structures are spaced apart in the given direction as disposed in vertical alignment with the blocks, respectively, below a corresponding one of the first and second memory array tiles.

17. The device of claim 13, wherein each of the bit line structures is electrically connected to a respective one of the page buffer circuits and is electrically separated from others of the page buffer circuits in each of the peripheral structures.

18. The device of claim 13, wherein at least one of the plurality of peripheral structures further comprises at least one of a control logic and a voltage generator.

19. The device of claim 13, further comprising an I/O structure for electrically connecting the CMOS circuit structure to an external electronic device, wherein the lower wiring structure further comprises I/O line structures which electrically connect the peripheral structures to the I/O structure.

20. The device of claim 19, wherein the I/O line structures each comprise I/O lines extending horizontally between the bit line structures and the CMOS circuit structure.

21. The device of claim 20, wherein an electrical resistance of each of the bit lines is greater than an electrical resistance of each of the I/O lines.

22. The device of claim 21, wherein a cross-sectional area of each of the I/O lines is larger than a cross-sectional area of each of the bit lines.

23. The device of claim 13, further comprising an upper semiconductor pattern located over the memory structure, wherein the memory structure comprises a two-dimensional array of vertical patterns such that the array comprises rows and columns of the vertical patterns, each of the bit line structures is commonly connected to the vertical patterns of a respective row of the vertical patterns in the array, and the upper semiconductor pattern is commonly connected to the vertical patterns, wherein the upper semiconductor pattern is electrically connected to the bit line structures through the vertical patterns.

* * * * *